United States Patent [19]

Kawamoto et al.

[11] Patent Number: 5,367,492
[45] Date of Patent: Nov. 22, 1994

[54] SEMICONDUCTOR MEMORY DEVICE PROVIDING REDUCED TEST TIME

[75] Inventors: Mitsuo Kawamoto, Nishikanbara, Japan; Yasushi Takahashi, Woburn, Mass.

[73] Assignees: Hitachi, Ltd, Tokyo; Hitachi device Engineering Co., Ltd., Chiba, both of Japan

[21] Appl. No.: 25,236

[22] Filed: Mar. 2, 1993

[30] Foreign Application Priority Data

Mar. 2, 1992 [JP] Japan .................................. 4-80362

[51] Int. Cl.$^5$ .......................... G11C 7/00; G11C 29/00
[52] U.S. Cl. ..................................... 365/201; 365/51; 365/63; 365/190; 365/206
[58] Field of Search ................... 365/189.04, 201, 190, 365/206, 63, 51, 72

[56]  References Cited

U.S. PATENT DOCUMENTS

| | | | |
|---|---|---|---|
| 4,958,325 | 9/1990 | Nakagome | 365/206 |
| 4,992,985 | 2/1991 | Miyazawa | 365/201 |
| 5,091,887 | 2/1992 | Asakura | 365/206 |
| 5,111,433 | 5/1992 | Miyamoto | 365/201 |
| 5,136,543 | 8/1992 | Matsuda | 365/190 |

FOREIGN PATENT DOCUMENTS 62-51096  3/1987  Japan .................................. 365/206

OTHER PUBLICATIONS

Nikkei Micro Device; Mar. 1, 1988; pp. 67–81 "16Mbit Dram Specifications close to finalization for '90 sample delivery".

*Primary Examiner*—Eugene R. LaRoche
*Assistant Examiner*—Son Mai
*Attorney, Agent, or Firm*—Antonelli, Terry, Stout & Kraus

[57]  ABSTRACT

In a memory cell array having a plurality of memory cells connected to store physical information levels different in adjoining pairs of complementary data lines, those pairs of the memory cells, with which are connected the memory cells for storing the physical information levels in an identical pattern, are connected with a plurality of input/output lines by a column select circuit, so that the plurality of memory cells may be caused to perform the writing operations simultaneously in a test mode by feeding an identical write signal to the plurality of input/output lines. In the test mode, moreover, the input write data are processed so that the physical information levels of adjoining memory cells to be simultaneously written in the plurality of memory cells may be coincident.

Since the information levels of the adjoining bits can be made physically identical or different by combining the address selection and the write data, it is possible to shorten the testing time.

48 Claims, 9 Drawing Sheets

SEMICONDUCTOR MEMORY DEVICE PROVIDING REDUCED TEST TIME

BACKGROUND OF THE INVENTION

The present invention relates to a semiconductor memory device and, more particularly, to technology which is effective if applied to the testing function of a RAM (i.e., Random Access Memory) intended to have its memory capacity increased, for example.

As semiconductor technology develops, dynamic RAMs have been developed which have a capacity as large as about 16 Mbits. In order that the testing time of such dynamic RAMs may be prevented from increasing in accordance with such enlarged memory capacity, a test mode function is given to shorten the testing time so that a plurality of consecutive pairs of complementary data lines may be selected by a column select switch. This type of dynamic RAM having the test mode function is exemplified on pp. 67 to 81 of "Nikkei Micro Device" issued on Mar. 1, 1988 by Nikkei McGRAW-HILL.

A dynamic RAM which has a memory cell array of data line twist type for reducing noises in operation from the adjoining data lines pairs is as disclosed in Japanese Patent Laid-Open No. 51096/1987.

SUMMARY OF THE INVENTION

Our investigations have revealed that the following problems are caused in the data line twist type memory by the fact that there are formed: an area A constructed of a lefthand half composed of exclusively either a true (T) bit, in which write data inputted to an identical word line from the outside and data written in a memory cell are identical, or a bar (B) bit, in which the write data inputted from the outside are inverted and written in the memory cell; and an area B constructed of a righthand half containing in a mixed manner the true (T) bit, in which the data inputted to the identical word line from the outside and the data written in the memory cell are identical, and the bar (B) bit in which the write data inputted from the outside are inverted and written in the memory cell.

In the former area A, nothing but the identical data can be written in a plurality of consecutive memory cells in the test mode in which a batch write is accomplished to shorten the testing time. In the area A, therefore, it is impossible to detect a leakage failure between the memory cells. In the latter area B, on the other hand, it is impossible to write the identical data in the plurality of consecutive memory cells in the test mode in which the batch write is accomplished to shorten the testing time. In the area A, therefore, the testing time is doubled because it is premised on twice writing operations that a failure for the data to leak from between the memory cells to a substrate or the like is to be detected.

An object of the present invention is to provide a semiconductor memory device aiming at shortening its testing time.

The aforementioned and other objects and novel features of the present invention will become apparent from the following description to be made with reference to the accompanying drawings.

A representative example of the invention to be disclosed herein will be summarized in the following. Specifically, in a memory cell array having a plurality of memory cells connected to store physical information levels different in adjoining pairs of complementary data lines, those pairs of the memory cells, with which are connected the memory cells for storing the physical information levels in an identical pattern, are connected with a plurality of input/output lines by a column select circuit, so that the plurality of memory cells may be caused to perform the writing operations simultaneously in a test mode by feeding an identical write signal to the plurality of input/output lines. In the test mode, moreover, the input write data are processed so that the physical information levels of adjoining memory cells to be simultaneously written in the plurality of memory cells may be coincident.

Since the information levels of the adjoining bits can be made physically identical or different according to the above-specified means by combining the address selection and the write data, it is possible to shorten the testing time.

DESCRIPTION OF THE PREFERRED EMBODIMENTS

Figure 3:
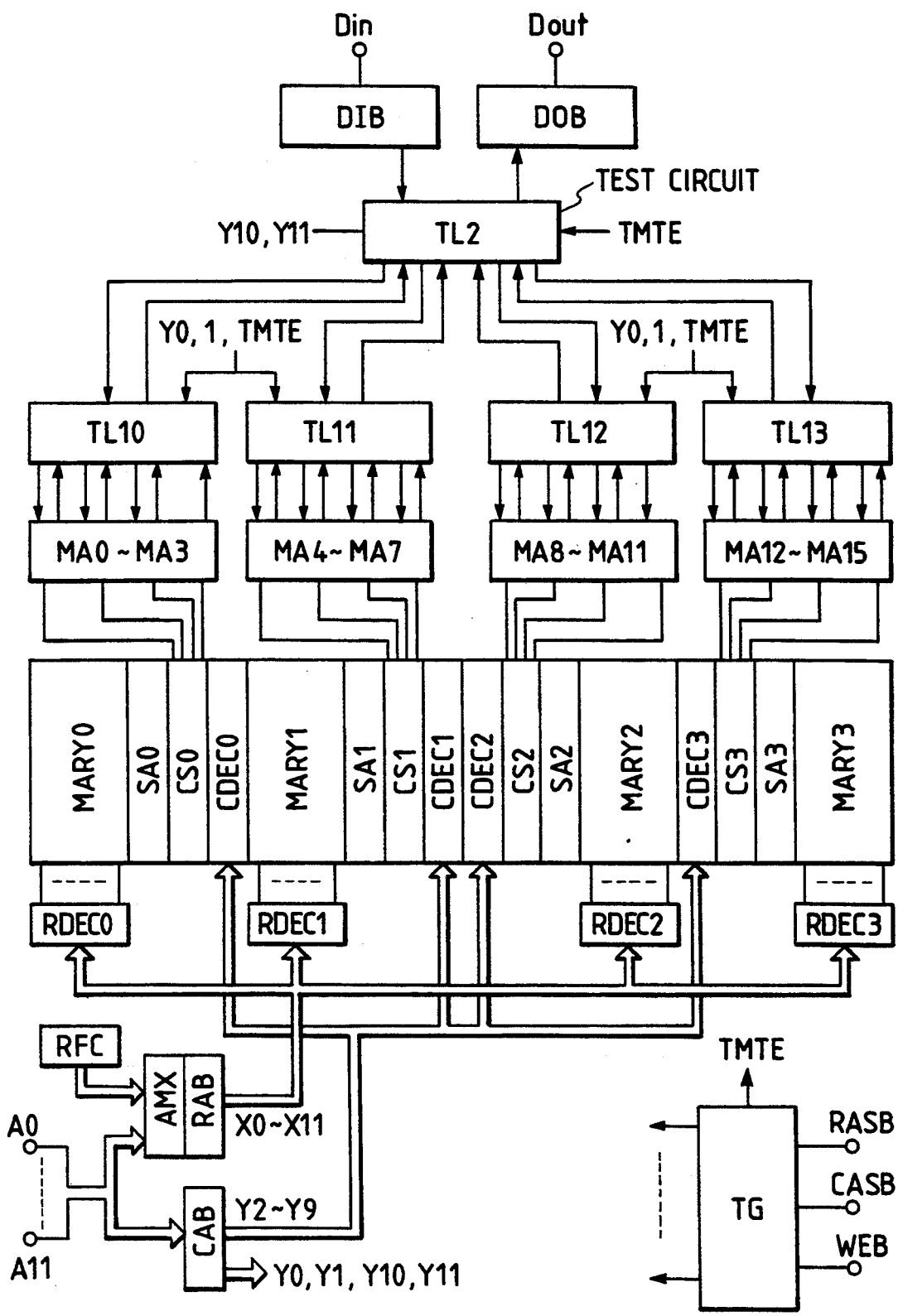
FIG. 3 is a block diagram showing an embodiment of a dynamic RAM according to the present invention.

FIG. 3 is a block diagram showing one embodiment of the dynamic RAM according to the present invention. The circuit elements composing the individual circuit blocks of FIG. 3 are formed over one semiconductor substrate made of single crystal silicon or the like by the well-known technology for manufacturing semiconductor integrated circuits.

In this embodiment, the dynamic RAM is constructed mainly of four memory cell arrays MARY0, MARY1, MARY2 AND MARY3. Each of these memory cell arrays MARY0 to MARY3 is given a memory capacity of about 4 Mbits. Thus, the dynamic RAM of this embodiment has a total memory capacity as large as about 16 Mbits.

The memory cell array MARY0 has its data lines composed of a pair of complementary data lines arranged in parallel. Four pairs of complementary data lines are grouped to effect a column selecting operation, although not especially limited thereto. One pair of complementary data lines are extended transversely of FIG. 3 to have their ends coupled to the input/output nodes of a sense amplifier SA0. Thus, the aforementioned complementary data lines are constructed in a two intersection form (of folded-back data lines).

The aforementioned four pairs of complementary data lines are connected by a column switch CS0 with four pairs of input/output lines (or common complementary data lines). The column switch CS0 has its switching operation controlled by a select signal selected by a column decoder CDEC0, to couple the four pairs of complementary data lines to the four pairs of input/output lines. The column decoder CDEC0 decodes the address signals Y2 to Y9 of a column (Y) system inputted from a column address buffer CAB, to produce a select signal of the aforementioned one group of column switches.

In the memory cell array MARY0, the word lines are extended in the longitudinal direction. A row decoder RDEC0 decodes the row (X) system address signals X0 to X11 inputted from a row address buffer RAB, to select one word line in the memory cell array MARY0.

The sense amplifiers SA1 to SA3, the column switches CS1 to CS3 acting as the address select circuits, the column decoders CDEC1 to CDEC3 and the row decoders RDEC1 to RDEC3 corresponding to the remaining three memory cell arrays MARY1 to MARY3 are given constructions similar to the aforementioned ones.

The dynamic memory cell performs its memory operation in dependence upon whether or not charges are stored in the capacitor. The information charges stored in the capacitor will be lost with time because a leakage current occurs. Thus, the dynamic memory cell is required to have a refresh operation in which it reads out the information charges and writes them in the original memory cell before they are lost. The refresh control circuit RFC produces a refreshing address signal. This refreshing address signal is inputted to a multiplexer AMX to the row address buffer RAB. Therefore, the row address buffer RAB selectively fetches the address signals inputted from address terminals A0 to A11 and the refreshing address signals for the memory access.

In the dynamic RAM, the row address signals X0 to X11 and the column address signals Y0 to Y11 are inputted in a time sharing manner in synchronism with address strobe signals RASB and CASB. The row address buffer RAB and the column address buffer CAB are activated by the operation timing signal, which is produced in synchronism with the aforementioned address strobe signal RASB and CASB, to fetch the individual addresses inputted in a time series manner.

The memory cell array MARY0 has its input/output lines (i.e., common complementary data lines) coupled to the inputs of main amplifiers MA0 to MA3. At the output side of the main amplifiers MA0 to MA3, there is disposed a test circuit TL10. This test circuit TL10 is given not only a write function to write the same write data simultaneously in a test mode by transmitting them to the four pairs of input/output lines and a degeneracy function to detect the coincidence and incoincidence of data of 4 bits read through the main amplifiers MA0 to MA3 and to degenerate them to a decision result of 1 bit but also a function to select of one quarter column in a normal mode. In other words, the test circuit TL10 is given a function to transmit the write data in a manner to correspond to one of the four pairs of input/output lines in response to the column address signals Y0 and Y1 and a function to select and output one read data from the four main amplifiers MA0 to MA3. A control signal TMTE is one for instructing the test mode.

The main amplifiers MA4 to MA7, MA8 to MA11 and MA12 to MA15 and the test circuits TL11, TL12 and TL13 corresponding to the remaining three memory cell arrays MARY1 to MARY3 are given constructions similar to the aforementioned ones. Thus, thanks to the test circuits TL10 to TL13, the read signals of 16 bits are degenerated in the test mode to the decision result of 4 bits.

The test circuit TL2 is given by the control signal TMTE and the column address Y10 and Y11 not only a function to transmit the same write data to the four test circuits TL10 to TL13 in the test mode and a function to further detect the detection outputs of the individual test circuits TL10 to TL13 to degenerate them to a decision result of 1 bit, but also a function to perform the one quarter column selecting operation in the normal mode. In other words, the test circuit is given a function to transmit the write data corresponding to one of the four memory cell arrays MARY0 to MARY3 in response to the column address signals Y10 and Y11 and a function to select the read signal corresponding to one of the four memory cell arrays MARY0 to MARY3.

A data input buffer DIB inputs the write data from an external terminal Din to the aforementioned test circuit TL2. In the normal mode, a data output buffer DOB outputs the read signal selected through the test circuit TL2 out of an external terminal Dout. In the test mode, the data read in parallel at the aforementioned unit of 16 bits are outputted as the decision result degenerated to 1 bit.

In response to the row address strobe signal RASB, the column address strobe signal CASB and the write enable signal WEB fed from the outside, a timing generating circuit TG generates the individual main timing signals necessary for the aforementioned dynamic RAM and the test mode control signal TMTE.

Figure 4:
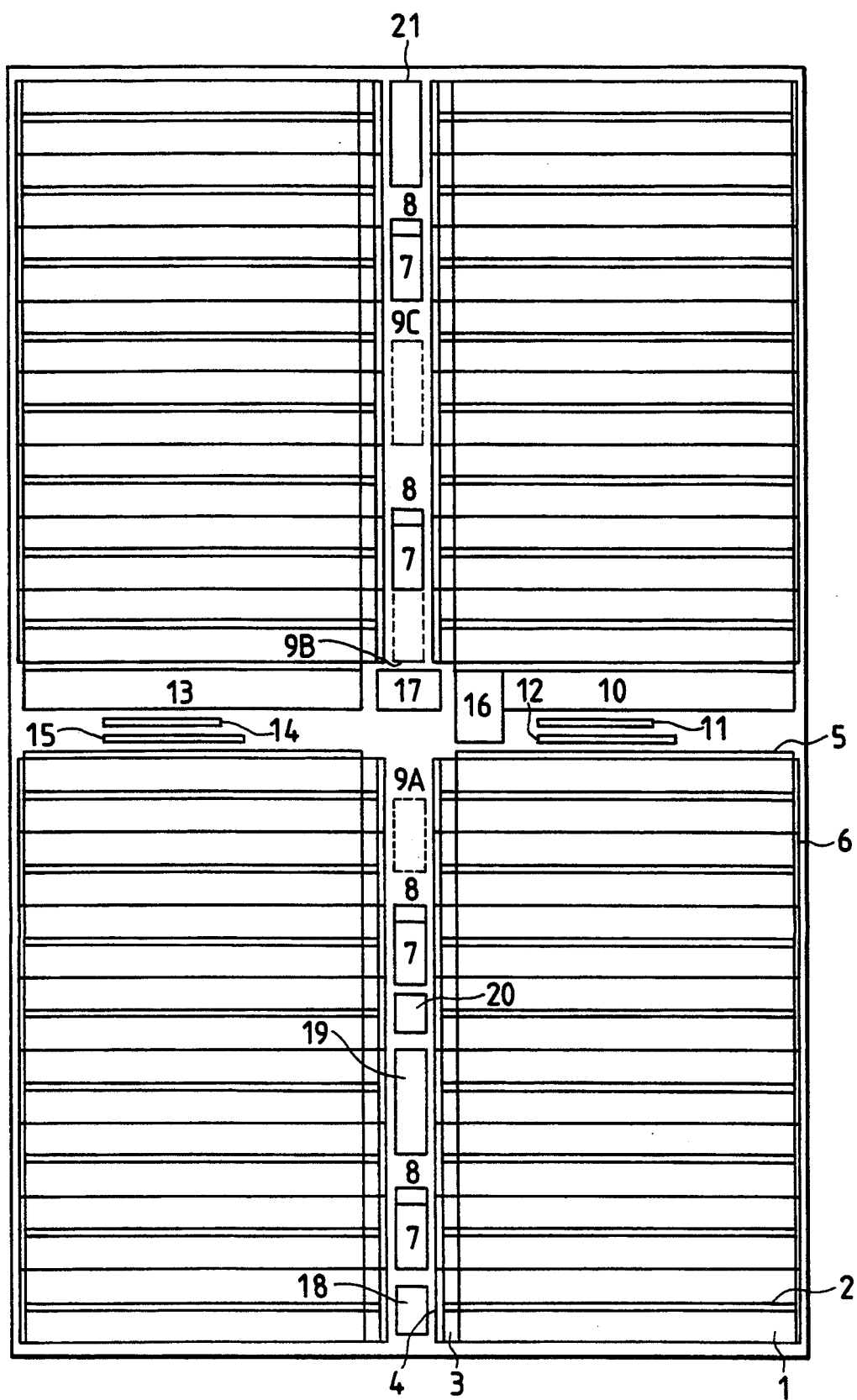
FIG. 4 is a layout showing one embodiment of the dynamic RAM to which is applied the present invention.

FIG. 4 is a layout showing one embodiment of the dynamic RAM to which the present invention is applied. This embodiment is devised in the following manner in the arrangement of the memory array unit constituting the dynamic RAM and the peripheral portion for the address selection or the like so that the operation rate may not be delayed by the elongations of the various wiring lengths of the control signals and the memory array drive signals due to the increase in the chip size accompanying the large capacity of the memories. In the following description, letters "MOSFET" are used to mean an insulated gate field effect transistor (IGFET).

In FIG. 4, there is formed a cross area which is formed of a longitudinal center portion and a transverse center portion of a chip. The cross area is arranged mainly with the peripheral circuits whereas the areas quartered by the cross area are arranged with the memory cell arrays. Specifically, the quartered memory cell arrays are formed in the four areas which are quartered by forming the cross area at the longitudinal and transverse center of the chip. The aforementioned fourth memory cell arrays correspond to the foregoing memory cell arrays MARY0 to MARY3 of FIG. 3 and individually have a memory capacity of about 4 M bits, although not especially limited thereto.

Figure 8:
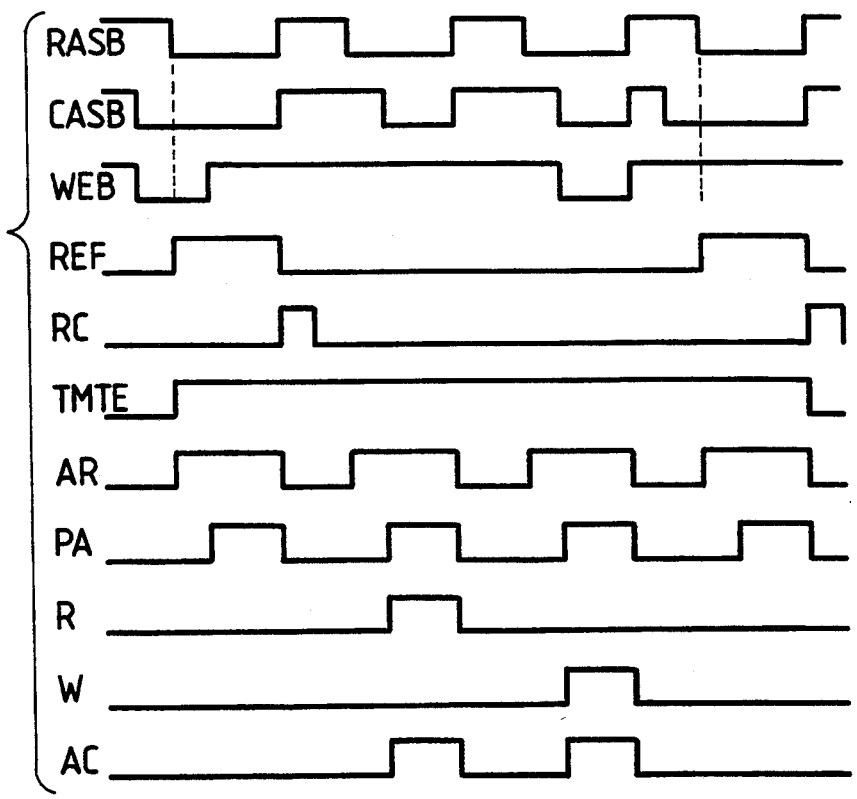
FIG. 8 is a timing chart for explaining one example of the operation of the dynamic RAM according to the present invention.

One memory cell array has memory mats 1 divided into sixteen. The memory mats 1 are arranged to have word lines extended transversely and a pair of complementary data lines or bit lines extended longitudinally in parallel. The paired memory mats 1 are arranged at the righthand and lefthand sides across sense amplifiers 2. These sense amplifiers 2 are commonly used in the so-called "shared sense amplifier manner" for the paired memory mats arranged at the righthand and lefthand sides. At the center side of the aforementioned quartered memory cell arrays, there is arranged a Y-select circuit 5. From this Y-select circuit 5, there extend Y-select lines over such a plurality of memory arrays as correspond to the Y-select circuit 5, thereby to switch the gates of the column switching MOSFETs of the individual memory mats. Incidentally, there is shown in FIG. 8 one embodiment in which the memory mat division according to the shared sense amplifier method is not used to facilitate the understanding of the present invention.

At the righthand side of the transverse center portion of the aforementioned chip, there are arranged: an X-system circuit 10 composed of an X-address buffer, an X-redundancy circuit and an X-address driver (or logic stage); a RAS control signal circuit 11, a WE signal control circuit 12; and a reference voltage generating circuit 16. This reference voltage generating circuit 16 is disposed near the center of that area and responds to an external power supply voltage VCC of about 5 V to generate a constant voltage VL corresponding to a voltage of about 3.3 V fed to an internal circuit. At the lefthand portion of the transverse center of the aforementioned chip, there are arranged: a Y-system circuit 13 composed of a Y-address buffer, a Y-redundancy circuit and a Y-address driver (or logic stage); a CAS control signal circuit 14; and a test circuit 15. At the center of the chip, there is arranged an internal voltage drop circuit 17 for producing a power supply voltage VCL for a peripheral circuit such as the address buffer or the decoder.

If the redundancy circuit including the address buffer and the corresponding address comparator circuit, and the CAS and RAS control signal circuits for generating the control clocks are concentrated and arranged in one portion, as described above, a high integration can be achieved by sharing the clock generator circuit and other circuits across the wiring channels, for example, that is, by sharing the aforementioned wiring channels. At the same time, the signals can be transmitted at the shortest equal distance to the address driver (or logic stage) or the like.

The RAS control circuit 11 is used to activate the X-address buffer in response to the signal RASB. The address signal fetched by the X-address buffer is fed to the X-system redundancy circuit. Here, tile address signal is compared with the faulty address stored, to decide whether or not a switching to the redundancy circuit is necessary. This result and the aforementioned address signal are fed to the X-system predecoder. This predecoder produces a predecode signal, which is fed through the X-address driver corresponding to each memory cell array to the X-decoder 3 corresponding to the aforementioned memory mat.

On the other hand, the internal signals of the aforementioned RAS system are fed to the WE control circuit and the CAS control circuit. For example, an automatic refresh mode (CBR) and a test mode (WCBR) are identified by deciding the input order of the RASB signal, the CASB signal and the WEB signal. In the test mode, the test circuit 15 is activated so that the test function is set in accordance with a specific address signal fed then.

The CAS control circuit 14 is used to produce the various Y-control signals in response to the signal CASB. The address signal fetched by the Y-address buffer in synchronism with the change of the signal CASB to the low level is fed to the Y-redundancy circuit. Here, the address signal is compared with the faulty address to decide whether or not a switching to the redundancy circuit is necessary. The result and the address signal are fed to the Y-predecoder. In this Y-predecoder, there is provided a predecode signal, which is fed to the individual Y-decoders through the Y-address drivers provided to correspond to the individual four memory cell arrays. At the same time, the aforementioned CAS control circuit 14 activates the adjoining test circuit 15 if it decides the test mode from the decision of the input order of the RASB signal and the WEB signal received.

The upper portion of the longitudinal center of the aforementioned chip is arranged with totally sixteen memory mats and eight sense amplifiers symmetrically across the center axis of the area. Of these, four sets of righthand and lefthand memory mats and sense amplifiers are corresponded to by four main amplifiers 7. These four main amplifiers correspond to those MA1 to MA3 and so on of FIG. 3. In addition, the upper portion of the longitudinal center is arranged with: a booster circuit 21 for selecting the word lines in response to an internal boost voltage; and input pad areas 9B and 9C responding to the input signals such as the address signals or the control signals. Internal voltage drop circuits 8 for producing the operation voltage of the sense amplifiers 2 are arranged to correspond to the aforementioned four sets of memory blocks divided transversely.

In this embodiment, one block is arranged with the eight memory mats 1 and the four sense amplifiers 2 so that the totally sixteen memory mats 1 and the eight sense amplifiers 2 are assigned symmetrically across the aforementioned longitudinal axis. According to this construction, the amplified signals from the individual sense amplifiers 2 can be transmitted through the short signal propagation paths to the main amplifiers 4 by using the reduced four main amplifiers 7.

The lower portion of the longitudinal center of the aforementioned chip is also arranged the totally sixteen memory mats and the eight sense amplifiers symmetrically of the center axis of the area. Of these, the four sets or righthand and lefthand memory mats and sense amplifiers are corresponded to by the four main amplifiers 7. In addition, the lower portion of the longitudinal center is arranged with: a substrate voltage generating circuit 18 for generating a negative bias voltage to be fed to the substrate, in response to the internal drop voltage; and an input pad area, a data output buffer circuit 19 and a data input buffer circuit 20 corresponding to the input signals such as the address signals or the control signals. The internal voltage drop circuits 8 for producing the operation voltages of the sense amplifiers 2 are arranged as in the above arrangement to correspond to the aforementioned four sets of memory blocks divided transversely. Thanks to this construction, as in the above arrangement, the amplified signals from the individual sense amplifiers 2 can be transmitted through the short signal propagation paths to the main amplifiers 4 by using the reduced four main amplifiers 7.

Although not shown, the area of the aforementioned longitudinal center is arranged with a variety of bonding pads in addition to the aforementioned areas 9A to 9C. These bonding pads are exemplified by those for feeding the external power supply voltages. The pads for feeding the earth potential of the circuit so as to increase the level margin of the input, i.e., to drop the power supply impedance are totally as many as ten and several and are generally arranged on a line. These earth potential pads are connected with the earth potential leads which are formed to extend longitudinally by the LOC technology. Of these, the grounding pads especially for clearing the word lines or preventing the floating of the unselected word lines of the word drivers due to their coupling or the grounding pads for the common source of the sense amplifiers are provided for dropping the power supply impedance mainly. As a result, the power supply potential is dropped for the operations of the internal circuits, and the several kinds of grounding lines between the internal circuits are connected through the low-pass filters composed of the LOC lead frame and the bonding wires, so that the ground potential of the circuit can minimize the production of noise and the propagation of the noise through the grounding lines between the internal circuits.

In this embodiment, the pads corresponding to the external power supply voltage VCC such as about 5 V are arranged to correspond to the internal voltage drop circuits 8 and 17 for the aforementioned voltage conversions. This arrangement is also made to suppress the power supply impedance and the noise propagation of the voltages (VCC, VDL and VCC) between the internal circuits.

The address inputting pads A0 to A11 and the control signal pads RASB, CASB and WEB are arranged in the aforementioned areas 9A to 9C. Additionally, there are also provided pads for inputting/outputting data, and the following pads for bonding master, monitoring, and monitor pad controlling operations. The bonding master pads are the pads for designating the static column mode and the pads for designating the write masking function in the nibble mode and at the time of constructing ×4 bits. The monitoring pads are the pads for monitoring the individual internal voltages VCL, VDL, VL, VBB, VCH and VPL.

Of these internal voltages, the voltage VCL is a power supply voltage for the peripheral circuit at about 3.3 V and is commonly produced by the internal voltage drop circuit 17. The voltage VDL is a power supply voltage to be fed to the memory cell array of about 3.3 V, i.e., the sense amplifiers 2 and is generated in this embodiment for each of the four memory blocks, as described above. The voltage VCH is a boost power supply voltage, i.e., the shared switch MOSFET for selecting the word line selecting level boosted to about 5.3 V in response to the aforementioned internal voltage VDL. The voltage VBB is a substrate back bias voltage of −2 V or the like; the voltage VPL is a plate voltage of the memory cells; and the voltage VL is a constant voltage of about 3.3 V to be fed to the internal voltage drop circuits 8 and 17. Incidentally, although the aforementioned individual internal voltages or control signals are omitted from FIG. 4, they are designated at the aforementioned letters, VCL, VDL, VL, VBB, VCH and VPL, and RASB, CASB and WEB so that the kinds of the voltages or control signals may be easily understood.

Figure 1:
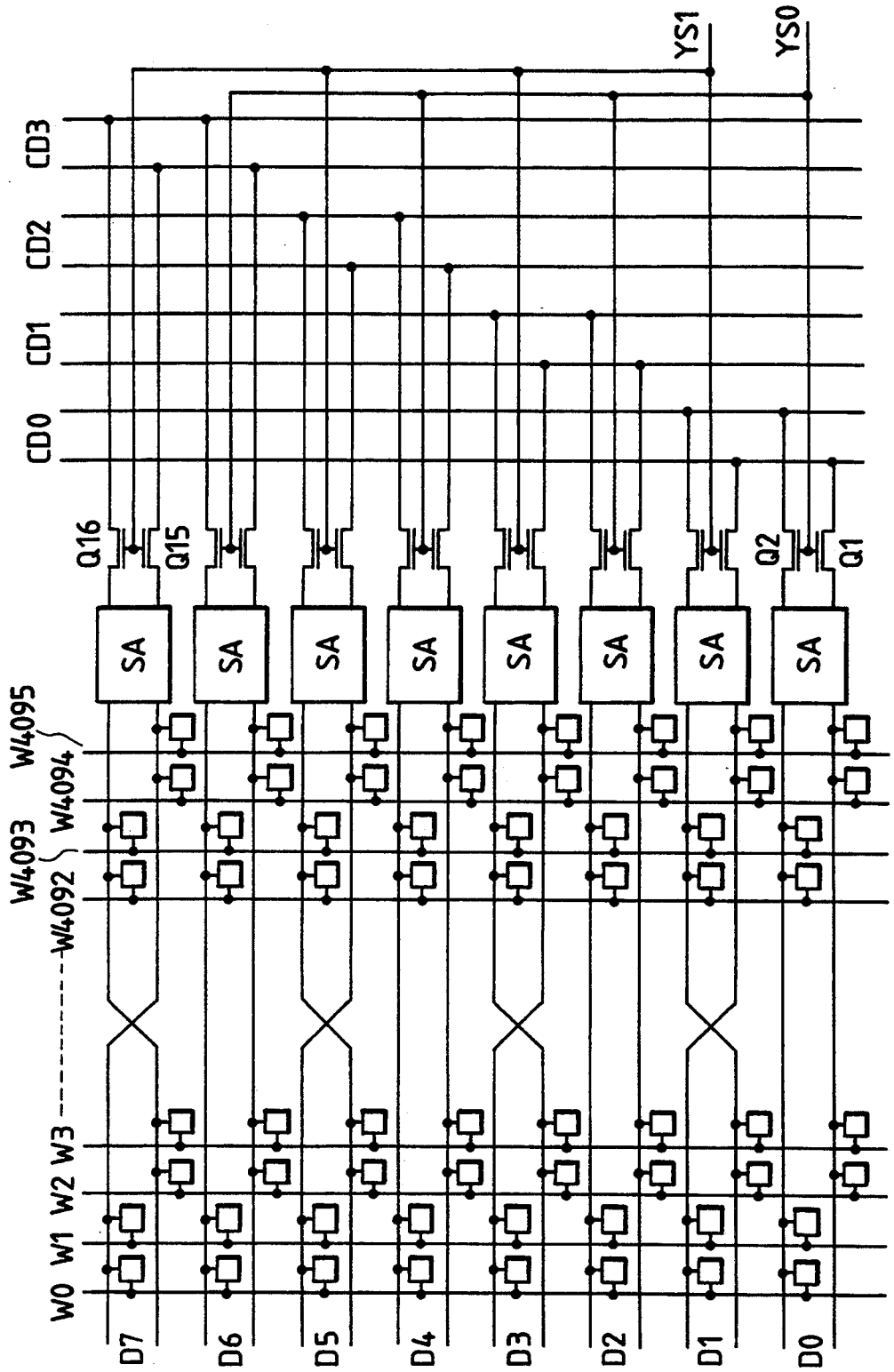
FIG. 1 is a circuit diagram showing one embodiment of a memory cell array unit and a data line select circuit in a dynamic RAM according to the present invention.

FIG. 1 is a circuit diagram showing one embodiment of the memory cell array unit and the data line select circuit in the dynamic RAM of the present invention.

In the memory cell array, as shown, there are shown as representative examples eight pairs of complementary data lines D0 to D7 and eight word lines W0 to W3 and W4092 to W4095, for example. The paired complementary data lines D0 to D7 are composed of pairs of non-inverted data lines and inverted data lines and are extended longitudinally of FIG. 1. Of these, the complementary data lines D0, D2, D4 and D6 have their aforementioned non-inverted and inverted data lines arranged in parallel. On the other hand, the alternate pairs of data lines D1, D3, D5 and D7 are constructed to have their non-inverted and inverted data lines intersecting at their middle portions by the twisting method. By adopting this twisting method of the data lines, the noise component due to the capacity coupling between the adjoining data lines can be offset in differential sense amplifiers SA. Thus, the sense amplifiers SA can sense fine read signals, which are read to the data lines from the selected memory cell, with high accuracy.

Each of the sense amplifiers SA is shown as a black box in FIG. 1, but has its amplification portion constructed of a latch circuit in which the input and output of two CMOS inverter circuits composed of a P-channel MOSFET and an N-channel MOSFET are crossly connected. The amplification portion starts its amplifying operation when it is fed with its operation voltage through the power switch MOSFET composed of the P-channel MOSFET and the N-channel MOSFET to be turned ON in response to the operation timing of the sense amplifiers. In the power switch MOSFET thus constructed, the fine signal amplitude of the complementary data lines is amplified relatively slowly when the MOSFET given a relatively low conduction and adapted to be turned ON immediately after the start of the sense amplifier is turned ON. When the level difference between the complementary data lines rises to some extent, the power switch MOSFET given a relatively high conductance is turned ON to change the signal amplified to the aforementioned first stage is quickly changed to the high level such as the power supply voltage and the low level such as the ground potential of the circuit. The operation timing signal for actuating such sense amplifiers SA is generated by the aforementioned timing generation circuit TG.

The column switch circuit of this embodiment connects four pairs of complementary data lines as one set with four pairs of input/output lines (i.e., common complementary data lines) CD0 to CD3. The input/output lines CD0 to CD3 are paired of non-inverted common data lines and inverted common data lines and are extended longitudinally of FIG. 1. In order to shorten the testing time, as described above, column select signals YS0 and YS1 are assigned respectively to the group composed of the four pairs of alternate complementary data lines D0, D2, D4 and D6 and the four pairs of alternate complementary data lines D1, D3, D5 and D7. In other words, the gates of column switches MOSFETs Q1 and Q2 for connecting the alternate pairs of complementary data lines D0, D2, D4 and D6 arranged in parallel and the input/output lines CD0, CD1, CD2 and CD3 are made common and fed with a column select signal YS0. On the other hand, the gates of column switches Q15 and Q16 for connecting the remaining alternate pairs of complementary data lines D1, D3, D5 and D7 twisted at their middle portions and the input/output lines CD0, CD1, CD2 and CD3 are made common and fed with the column select signal YS1. Although the sixteen column switches MOSFETs are shown in FIG. 1 by way of example, the circuit symbols are attached exclusively to the column switches MOSFETs Q1 and Q2 corresponding to the complementary data lines D0 and the column switches MOSFETs Q15 and Q16 corresponding to the complementary data lines D7.

The totally four memory cell arrays of FIG. 1 are provided, as shown in FIG. 3. Thus, the data totally of 16 bits are read in parallel, as described before. In the writing operation in the normal mode with the construction of ×1 bit, on the other hand, the write data are fed only to one pair of input/output lines in any memory cell array. Thus, the writing operation is accomplished only in the selected memory cell which is attached to the complementary data lines connected with the aforementioned one pair of input/output lines.

In the later-described test mode, the same write data corresponding to the write data of 1 bit fed from the external terminal Din are inputted to the four pairs of input/output lines which are provided to correspond to the individual memory cell arrays MARY0 to MARY3. Thus, the 16 bits can be simultaneously written in the writing operations in the test mode. Then, thanks to the aforementioned construction of the column switch, in case the word line W0 of the lefthand half area of the word lines W0 to W2047 is selected, the write data are set to a logic 1 (or logic 0) when the simultaneous writing operation is performed in response to the column select signal YS0, and the write data are set to the logic 0 (or logic 1) when the simultaneous writing operation is performed in response to the column select signal YS1. Thus, it is possible to equalize the physical information levels to be stored in the memory cells adjoining with respect to the word line W0.

If the lower one of the paired input/output terminals of the sense amplifiers SA is used for the non-inverted input/output whereas the upper one is used for the inverted input/output, the memory cells are connected with the inverted data lines in the complementary data lines D0, and the memory cells are connected with the non-inverted data lines in the complementary data lines D1 by the twist. These connection relations likewise apply to the other complementary data lines D2, D4 and D6, and the complementary data lines D3, D5 and D7 to be simultaneously selected. Therefore, the stored information at the physically equal high level is written in response to the column select signal YS0 in the memory cells connected with the word line W0. And, the input data corresponding to the logic 0 may be fed from the external terminal Din when the four pairs of complementary data lines D0, D2, D4 and D6 are to be selected.

Specifically, if the input data at the logic 0 are fed from the external terminal Din, the inverted ones of input/output lines CD0 to CD3 are raised to the high level, and this high level is transmitted to those inverted data lines of the complementary data lines D0. D2, D4 and D6, which are simultaneously selected, as described above, through the column switch corresponding to the aforementioned column select signal YS0. As a result, the high level is written simultaneously in the four memory cells connected with the inverted data lines.

When the four pairs of complementary data lines D1, D3, D5 and D7 are to be selected in response to the column select signal YS1, the input data corresponding to the logic 1 may be fed from the external terminal Din. Specifically, if the input data of the logic 1 are fed from the external terminal Din, the non-inverted input/output sides of the input/output lines CD0 to CD3 are raised to the high level, and this high level is transmitted to the non-inverted data lines of the complementary data lines D1, D3, D5 and D7 to be simultaneously selected, as described above, through the column switches corresponding to the aforementioned column select signal YS1. As a result, the high level is written simultaneously in the four memory cells connected with the aforementioned non-inverted data lines.

In the word lines W2 and W3, on the other hand, the arrangement of the memory cells with respect to the complementary data lines is inverted so that the logic of the write data inputted from the external terminal Din is inverted from the aforementioned one. Likewise in the lefthand half of the word lines W0 to W2047, the write data to be inputted from the external terminal Din are determined considering the combination of the addresses of the word lines selected and the addresses of the data lines selected.

In the righthand half of the word lines W2048 to W4095, the relations between the complementary data lines and the input terminals of the sense amplifiers SA are made identical independently of the data line twist. In case the word line W4092, as shown by way of example, is selected, when the stored information at the same high level (or low level) is written in all the memory cells, the data of the logic 0 (or logic 1) may be likewise inputted for an even address of the column select signal YS0 or the like, and the data of the logic 0 (or logic 1) may be inputted contrary to the aforementioned lefthand half for an odd address of the column select signal YS1 or the like. In other words, the writing input data may then be determined considering exclusively the addresses of the word lines independently of the column address.

If the stored levels of the adjoining bits are different with respect to the direction of the data lines, the logic of the write data inputted from the external terminal Din may be determined for the simultaneous writing operation of every 4 bits per each memory cell in accordance with the combination of the addresses of the word lines and the column addresses. Thus, by making use of the parallel writing operation of 16 bits in the entirety of the dynamic RAM, it is possible to quickly accomplish the previous writing operations for setting the adjoining memory cells to the identical level so as to examine the leakage fault of the data from the memory cells to the substrate or the like and for setting the adjoining memory cells to the complementary levels so as to examine the leakage fault between the memory cells.

Figure 2:
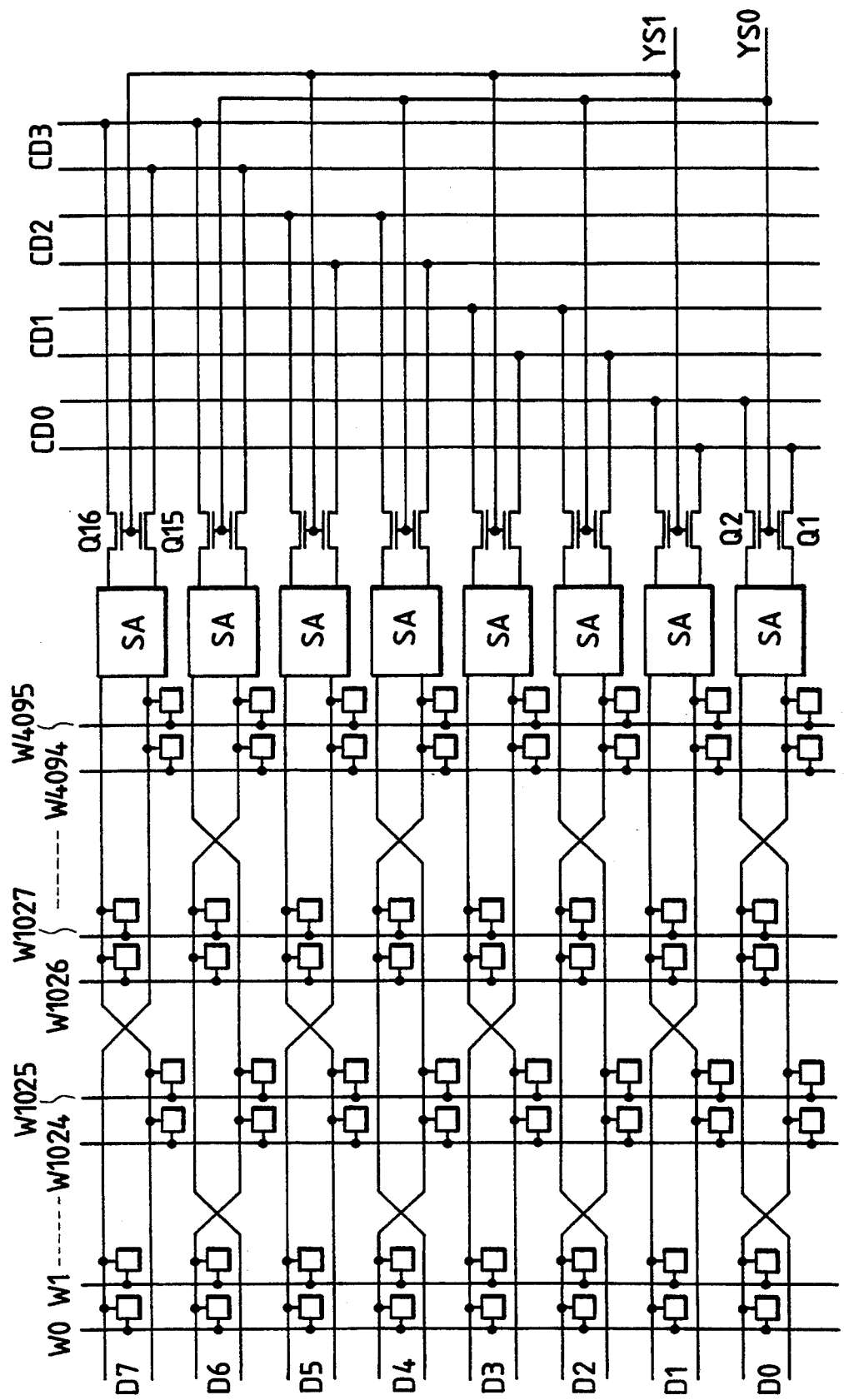
FIG. 2 is a circuit diagram showing another embodiment of a memory cell array unit and a data line select circuit in a dynamic RAM according to the present invention.

FIG. 2 is a circuit diagram showing another embodiment of the memory cell array unit and the data line select circuit in the dynamic RAM according to the present invention.

In the memory cell array of FIG. 2, there are representatively shown the eight pairs of complementary data lines D0 to D7 and the eight word lines W0 and W1, W1024 and W1025, W1026 and W1027, and W4094 and W4095. The aforementioned complementary data lines D0 to D7 are paired of the non-inverted data lines and the inverted data lines and are extended in the longitudinal direction of FIG. 2. Of those pairs, the paired complementary data lines D0, D2, D4 and D6 are constructed at even positions (or two positions, as shown) according to the twist method, by which the non-inverted data lines and the inverted data lines are caused to intersect each other. On the other hand, the alternate pairs of the data lines D1, D3, D5 and D7 are constructed at odd positions (or one middle position, as shown) according to the twist method, in which the non-inverted data lines and the inverted data lines are caused to intersect each other. Thus in the data line twist method, the noise component due to the capacity coupling between the adjoining data lines are offset like before in the differential sense amplifiers SA so that the fine signals read from the memory cells to the data lines can be sensed highly accurately.

The column switch circuit of this embodiment connects one set of four pairs of complementary data lines with the four pairs of input/output lines (or complementary data lines) CD0 to CD3. The column switches MOSFETs Q1 and Q2 for individually connecting the alternate pairs of complementary data lines D0, D2, D4 and D6, in which the non-inverted data lines and the inverted data lines are caused to intersect and replaced in the even positions, and the input/output lines CD0, CD1, CD2 and CD3 have their gates fed with the column select signal YS0. On the other hand, the column switches MOSFETs Q15 and Q16 for individually connecting the remaining alternate pairs of complementary data lines D1, D3, D5 and D7, in which the non-inverted data lines and the inverted data lines are caused to intersect and replaced in the odd positions, and the input/output lines CD0, CD1, CD2 and CD3 have their gates fed with the column select signal YS1. In FIG. 2, sixteen column switches MOSFETs are shown by way of example. Of these, the column switches Q1 and Q2 corresponding to the complementary data lines D0 and the column switches Q15 and Q16 corresponding to the complementary data lines D7 are exclusively given the circuit symbols.

Every two word lines W0 and W1, W1024 and W1025, W1026 and W1027, and W4094 and W4095 representing the four areas in a manner to correspond to the aforementioned data line twist method are shown by way of example. Specifically, when any of the 4096 word lines is to be selected, the arrangement (i.e., the true bits/the bar bits) relative to the paired complementary data lines D of the memory cell selected belongs to any of the four combinations of the word lines. Incidentally, the word lines W2 and W3 subsequent to the word lines W0 and W1 are reversed from the word lines W0 and W1 in connection with the data lines to be connected with the memory cells. These reversed relations likewise apply to the other representative word lines W1024 and W1025, W1026 and W1027, and W4094 and W4095.

In this embodiment, too, the four pairs of complementary data lines D0, D2, D4 and D6 to be simultaneously selected by the column switches are subjected to the mutual data line twist in the same pattern so that they can write physically identical memory levels. Likewise, the four pairs of complementary data lines D1, D3, D3 and D7 to be simultaneously selected by the column switches are subjected to the mutual data line twist in the same pattern so that they can write physically identical memory levels. Thus, by combining the selected addresses of the word lines, the selected addresses of the column switches and the write data inputted from the external terminal Din, the memory array can be set in its entirety to the physically identical level or can be given the reversed levels between the adjoining memory cells while making use of the simultaneous write mode of the 4 bits (or totally 16 bits) in the test mode.

Figure 5:
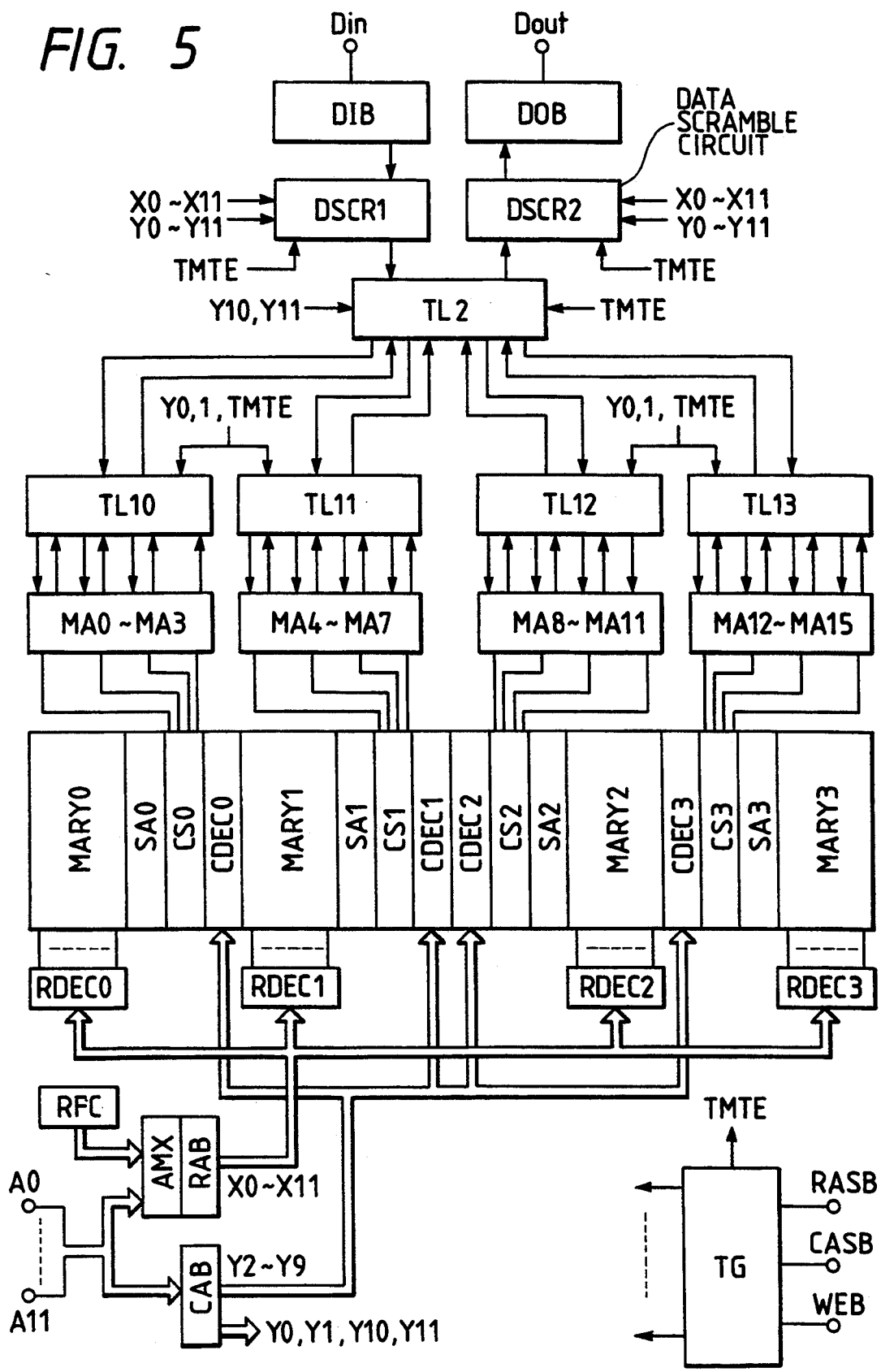
FIG. 5 is a block diagram showing another embodiment of the dynamic RAM according to the present invention.

FIG. 5 is a block diagram showing another embodiment of the dynamic RAM according to the present invention. The circuit elements constructing the individual circuit blocks of FIG. 5 are formed over one semiconductor substrate of single crystal silicon by the well-known technology for manufacturing semiconductor integrated circuit devices. The major blocks of FIG. 5 are similar to those of the foregoing embodiment of FIG. 4 excepting the following points. Thus, the description of the common portions will be omitted.

Figure 10:
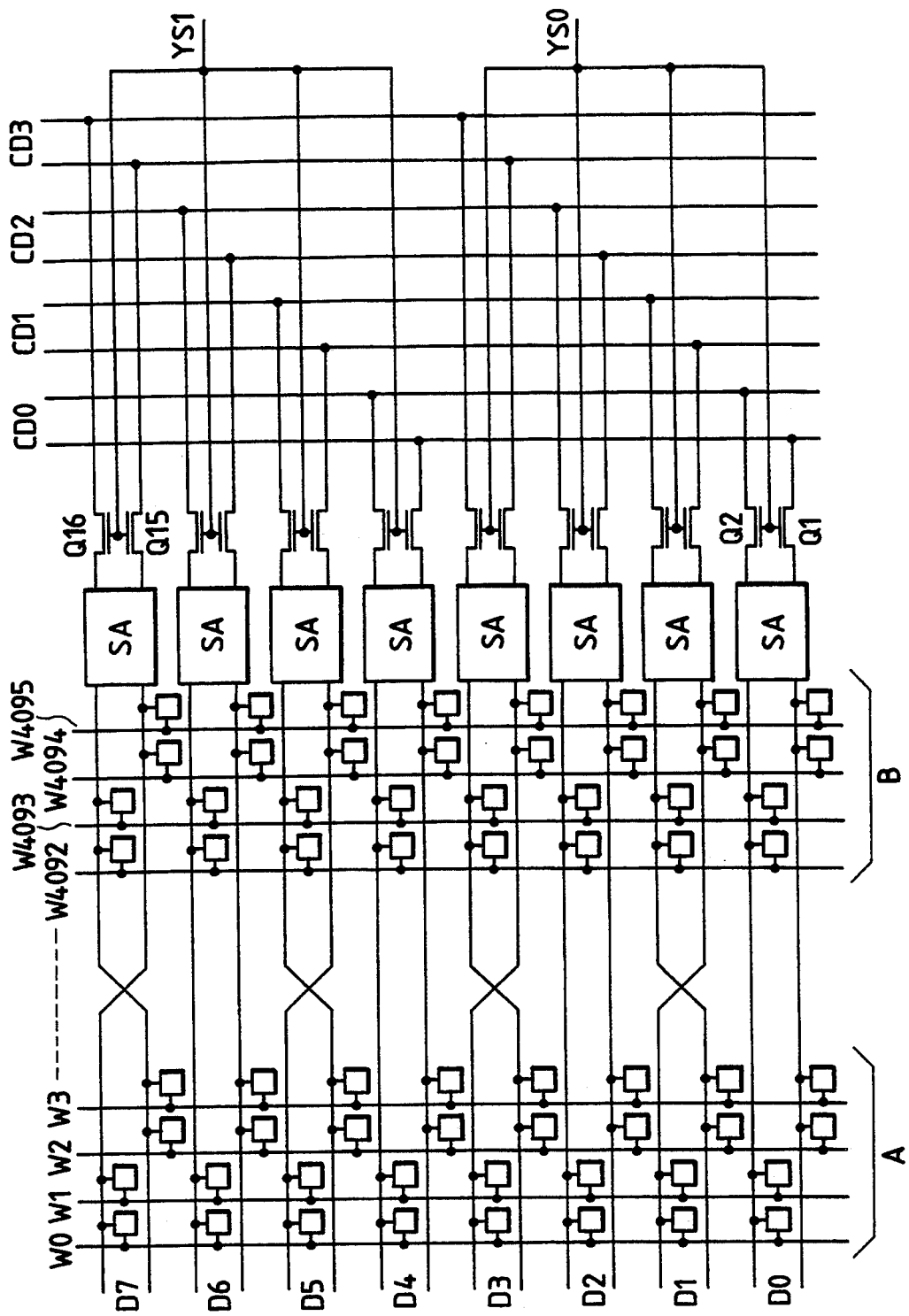
FIG. 10 is a circuit diagram showing one example of a memory cell array unit and a data line select circuit in the dynamic RAM of FIG. 5.

The memory cell arrays MARY0 to MARY3 are given the construction shown in FIG. 10, for example. In other words, the adjoining complementary data lines to be simultaneously selected by the column switches are simultaneously selected and connected with the corresponding input/output lines either depending upon the presence of the data line twist or independently of the pattern of the data line twist.

In this construction, if the simultaneous writing operations are performed in the aforementioned test mode, the physical memory levels to be stored in the memory cells are separated according to the combination of the row addresses (of the word lines) and the column addresses (of the data lines). In this embodiment, therefore, data scramble circuits DSCR0 to DSCR3 are added to the test circuits TL10 to TL13.

This will be described with reference to FIG. 10. In case the word line W0 is brought into a selected state to write the physically identical memory level in the four memory cells selected in response to the column select signal YS0, the write data fed to the input/output lines CD1 and CD3 corresponding to the complementary data lines D1 and D3 having been subjected to the data line twist are inverted by the aforementioned data scramble circuit DSCR0. Here, it is assumed like before that the sense amplifiers SA have the non-inverted inputs at their lower terminals and the inverted inputs at their upper terminals. When the write data of the logic 0 are inputted from the external terminal Din, for example, the data are inverted at the input/output lines CD0 and CD2 by the data scramble circuit DSCR0, and the low level is transmitted to the inverted input/output line side (B), so that the inverted data lines (B) of the complementary data lines D0 and D2 corresponding to the inverted input of the sense amplifiers SA are dropped to the low level through the column switches. Thus, the low level is written in the memory cell selected by the word line W0. In the input/output lines CD1 and CD3, on the other hand, the low level is transmitted to the non-inverted input/output line side so that the non-inverted data lines of the complementary data lines D1 and D3 corresponding to the non-inverted inputs of the sense amplifiers SA are dropped to the low level through the column switches. These non-inverted data lines are twisted at their middle portions and extended leftward and are equipped with the memory cells at their intersections with the aforementioned word line W0. Thus, the low level is written in the memory cell selected by the word line W0. As a result, the two of the four memory cells selected simultaneously by the column select signal YS0 are connected with the inverted data lines whereas the remaining two are connected with the non-inverted data lines, but they can write the memory information at the physically identical low level.

In case the complementary data lines D intersect at their middle portions, as shown in FIG. 10, of the address signals X0 to X11 designating the word lines W0 to W4095, the lefthand half corresponding to the area A is selected according to the low level of the address X11 at the most significant bit, and the righthand half corresponding to the area B is selected according to the high level of the address signal X11. Thus, the data scramble circuit DSCR0 uses that address signal to determine whether or not the write data to be fed to the aforementioned input/output lines CD1 and CD3 are to be inverted.

Since every two of the word lines W0 and W1, and W2 and W3 in the memory cell array are connected with the common complementary data lines, the memory cells corresponding to the word lines W0 and W1 are selected in response to the low level of the address signal X1, and the memory cells corresponding to the word lines W2 and W3 are selected in response to the high level of the address signal X1. In the data scramble circuit DSCRO, therefore, if the high/low levels of the address X1 are decided to control the inversion and non-inversion of the write data inputted, the memory information can be set to the physically high or low level in response to the logic 1 or 0 inputted from the external terminal Din but independently of the address of the X system. In other words, since the memory cells are connected in a predetermined regularity with the folded-back bit lines, the logic level inputted from the external terminal Din and the memory level to be actually stored in the memory cells can be set, even if different, to an identical level in the test mode. In short, the actual memory level to be stored in the memory cells can be set according to the data inputted from the external terminal Din but without considering the arrangement of the memory cells.

In the embodiment of FIG. 5, all the row address signals X0 to X11 are fed, as shown, to the data scramble circuit DSCRO so as to match all the layout patterns of the memory cell array, but the address signal to be used is determined according to the arrangement of the complementary data lines of the individual memory cell array. In the data line twist method, as shown in FIG. 10, for example, only the address signal X11 is sufficient, as described above. When another function is added to cause the external input data and the memory level stored in the memory cells to coincide, as described above, it is sufficient to add the address signal X1. This data scramble circuit DSCR0 is operated only in the test mode in response to the control signal TMTE.

In case the data lines of the memory cell array adopt the layout shown in FIG. 2, the inversion and non-inversion of the aforementioned write data may be controlled by the decode signal of 2 bits, which is prepared by adding the address signal X10 to the address signal X11, as described above, while considering that the memory cell array is divided in its entirety into the four areas. If another function is added to cause the external input data and the memory level to be stored in the memory cells to coincide, it is sufficient to add the address signal X1. The data scramble circuits DSCR1 to DSCR3 provided to correspond to the remaining memory cell arrays MARY1 to MARY3 are given constructions similar to the aforementioned one.

Figure 6:
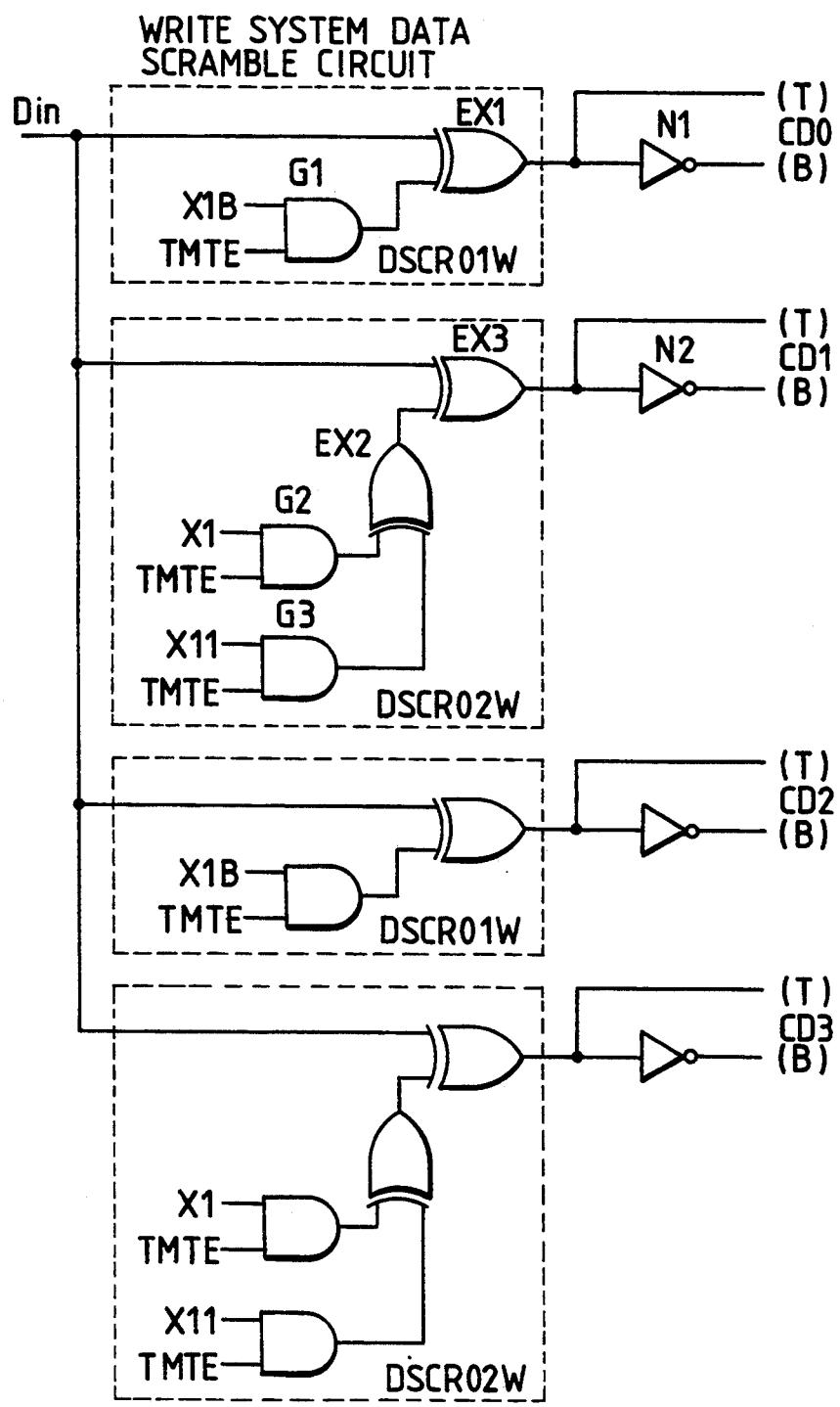
FIG. 6 is a circuit diagram showing one embodiment of a write system data scramble circuit to be packaged in the dynamic RAM of FIG. 5.

FIG. 6 is a circuit diagram showing one embodiment of the write system data scramble circuit.

The write data Din inputted from the outside are changed according to their addresses by two kinds of write system data scramble circuits DSCR01W and DSCR02W. Specifically, in the constructions of the memory cell arrays and the column switches shown in FIG. 10, the data may be inverted with the address signal X1 at the less significant second bit, as described above, in the input/output line CD0 corresponding to the complementary data line D0 on which no twist is performed. Thus, there is provided the data scramble circuit DSCR01W which is constructed of an AND gate circuit G1 made receptive of an address signal X1B and the test mode control signal TMTE and an exclusive OR circuit EX1 to be controlled by the output signal of the AND gate circuit G1.

In this circuit DSCR01W, the output signal of the AND gate circuit G1 takes the high level (or logic 1) in response to the address signal X1B and the control signal TMTE, which are raised to the high level when the word lines W0 and W1 are selected. If the write data Din is at the high level of the logic 1, the circuit DSCR01W produces an output signal or a coincidence output having the low level of logic 0. This output signal at the low level is transmitted to the true side (T) of the input/output line CD0 to raise the bar side (B) of the input/output line CD0 to the high level through an inverter circuit N1. As a result, the inverted one of the complementary data lines D0 selected through the column switch takes the high level so that the writing operation is performed at the high level in the memory cell coupled thereto.

If the write data Din is at the low level of the logic 0 when the output signal of the aforementioned AND gate circuit G1 is at the high level, the output signal or the incoincidence output at the high level of the logic 1 is produced. This output signal at the high level is transmitted to the true side (T) of the input/output lines CD0 to drop the bar side (B) of the input/output lines CD0 to the low level through the inverter circuit N1. As a result, the inverted one of the complementary data lines D0 selected through the column switches is dropped to the low level to effect the writing operation at the low level in the memory cells coupled thereto. Thus, the physical data at the high/low levels corresponding to the write data can be written in the memory cells.

In the aforementioned circuit DSCR01W, the output signal of the AND gate circuit G1 is dropped to the low level (or the logic 0) in response to the address signal X1B which is dropped to the low level when the word lines W2 and W3 are selected. If the write data Din are at the high level of the logic 1, the output signal or the incoincidence output at the high level of the logic 1 is produced. This output signal at the high level is transmitted to the true side (T) of the input/output lines CD0 to drop the bar side (B) of the input/output lines CD0 to the low level through the inverter circuit N1. Thus, the non-inverted one of the complementary data lines D0 selected through the column switch is raised to the high level to effect the writing operation at the high level in the memory cells coupled thereto.

If the write data Din are at the low level of the logic 0 when the output signal of the aforementioned AND gate circuit G1 is at the low level, the output signal or the coincidence output at the low level of the logic 0 is produced. This output signal at the low level is transmitted to the true side (T) of the input/output lines CD0 to raise the bar side (B) of the input/output lines CD0 to the high level through the inverter circuit N1. As a result, the non-inverted one of the complementary data lines D0 selected through the column switch is dropped to the low level to effect the writing operation at the low level in the memory cells coupled thereto. As a result, the memory cells can write the physical data at the high/low levels corresponding to the write data.

In the constructions of the memory cell arrays and the column switches, as shown in FIG. 10, the inversion/non-inversion of the aforementioned write data Din are performed in the input/output lines CD1 corresponding to the complementary data lines D1 having their middle portions twisted, by using not only the address signal X1 at the less significant second bit, as described above, but also the address signal X11 for dividing the lefthand area A and the righthand area B of the memory cell arrays.

In the data scramble circuit DSCR02W corresponding to the complementary data lines D having been twisted, as described above, the control signal of an exclusive OR circuit EX3 for controlling the inversion/non-inversion of the aforementioned write data Din is produced by the actions of: an AND gate circuit G2 made receptive of the address signal X1 and the control signal TMTE, which are dropped to the low level when the aforementioned word lines W0 and W1 are selected; an AND gate circuit G3 made receptive of the address signal X11 and the control signal TMTE for dividing the aforementioned lefthand side area A and righthand side area B; and an exclusive OR circuit EX2 made receptive of the output signals of those gate circuits G2 and G3.

The righthand side area B of the memory array may substantially perform the same operation as that of the data scramble circuit DSCR01W because it is not influenced by the aforementioned data line twist. Specifically, in the righthand side area B, the output signal of the AND gate G3 takes the high level in response to the high level of the address signal X11 so that the exclusive OR circuit EX2 inverts and transmits the output signal of the AND gate circuit G2. Thus, the writing operation similar to that of the case of no data line twist is performed in the righthand side area B of the aforementioned memory cell array.

In the lefthand side area A of the memory cell array, the inverted data lines and the non-inverted data lines are interchanged by the aforementioned data line twist so that the data scramble is performed contrary to that of the righthand side area B. Specifically, in response to the low level of the address signal X11, the output signal of the AND gate circuit G# is dropped in the test mode to the low level in response to the high level of the control signal TMTE. Therefore, the exclusive OR circuit EX2 transmits the output signal of the AND gate circuit G2 as it is. In other words, when the word lines W0 and W1 are selected in response to the address signal X1, the write data Din are inverted and transmitted. When the word lines W2 an W3 are selected, the write data Din are transmitted as they are.

In the following, the input/output lines CD2 having no data line twist are equipped with the aforementioned data scramble circuit DSCR01W, and the input/output lines CD3 having the data line twist are equipped with the aforementioned data scramble circuit DSCR02W.

Figure 7:
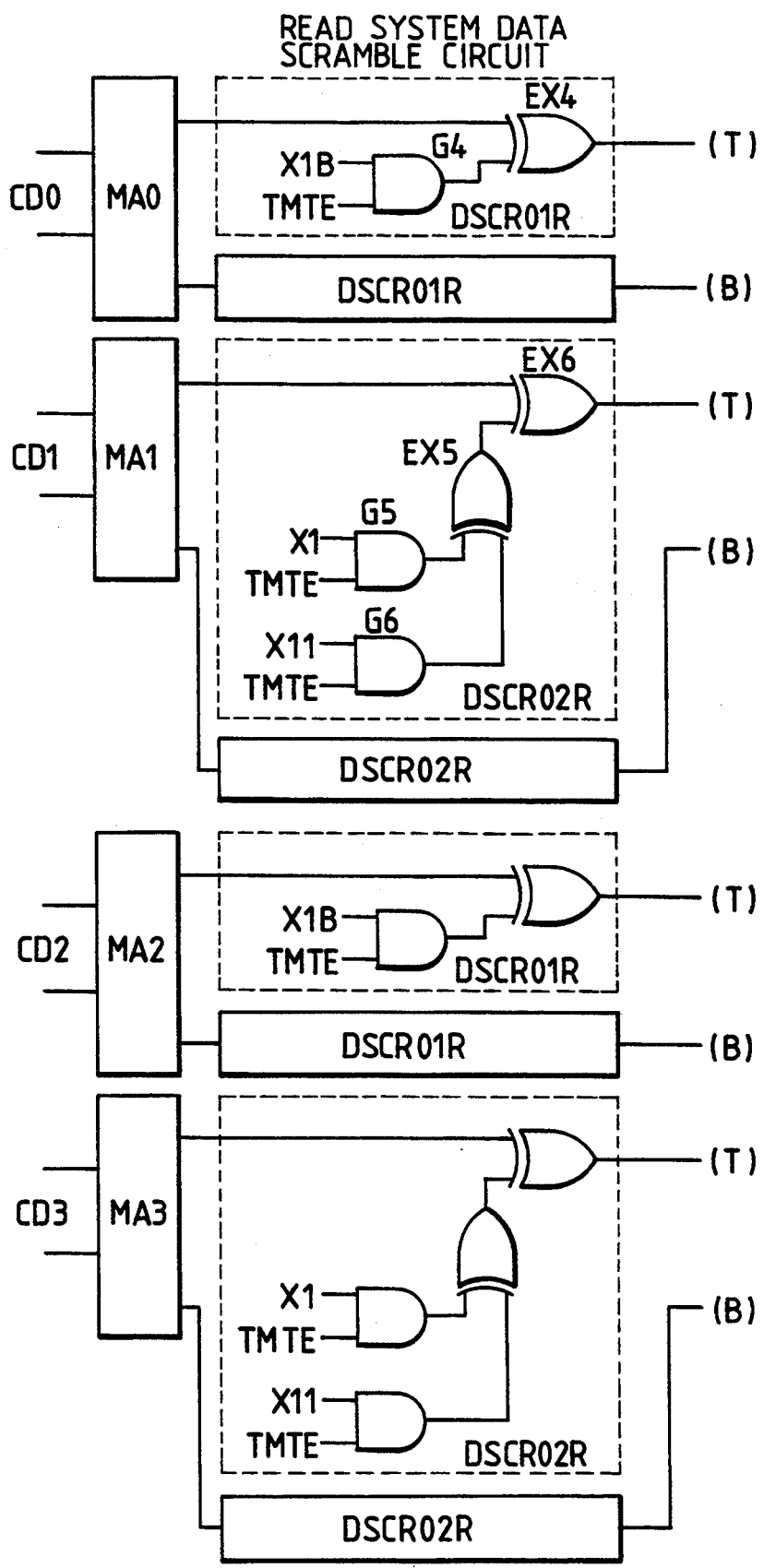
FIG. 7 is a circuit diagram showing one embodiment of a read system data scramble circuit to be packaged in the dynamic RAM of FIG. 5.

FIG. 7 is a circuit diagram showing one embodiment of the read system data scramble circuit. This read system data scramble circuit returns the data scramble of the writing operation. By returning the data in this way, it is possible to achieve the test decision result which is degenerated to 1 bit by the test circuit TL10 constructed of a simple gate circuit.

The read signals from the memory cells are amplified by the main amplifiers MA0 to MA3. These amplified output signals are changed according to their addresses by two kinds of read system data scramble circuits DSCR01R and DSCR02R. Specifically, in the constructions of the memory cell arrays and the column switches of FIG. 10, the output of the main amplifier MA0 made receptive of the output signal of the input/output lines CD0 corresponding to the complementary data lines D0 having no twist may have its data inverted in response to the address signal X1 at the less significant second bit, as described above. Thus, there is provided the data scramble circuit DSCR01R which is constructed of an AND gate circuit G4 made receptive of the address signal X1B and the test mode control signal TMTE, and an exclusive OR circuit EX4 to be controlled by the output signal of the AND gate circuit G4. In the same Figure, a specific circuit of the non-inverted side (T) of the main amplifier MA0 is shown by way of example. At the inverted side (B), too, there is provided the data scramble circuit DSCR01R which is constructed of circuits similar to the aforementioned ones.

The inverted side (B) may produce the output signal of the aforementioned non-inverted side (T) by inverting it with the inverter circuit. On the other hand, the output signal of the non-inverted side may be produced by inverting the output signal of the data scramble circuit DSCR01R at the inverted side (B). Thus, the AND gate circuit and the exclusive OR circuit can be replaced by the inverter circuit so that the circuit construction can be remarkably simplified.

In this circuit DSCR01R, if the output signal of the AND gate circuit G4 is raised to the high level (of the logic 1) in response to the address signal X1B and the control signal TMTE, which are raised to the high level when the word lines W0 and W1 are selected, so that the non-inverted output signal of the main amplifier MA takes the high level of the logic 1, the output signal or the coincidence output at the low level of the logic 0 is produced. This output signal at the low level is transmitted to the true side (T). When the inverted output of the main amplifier MA0 is at the low level of the logic 0, the output signal at the high level is transmitted to the bar side (B). If the non-inverted output of the main amplifier MA0 is at the low level of the logic 0 when the output signal of the aforementioned AND gate circuit G4 is at the high level, the output signal or the incoincidence output at the high level of the logic 1 is produced. This output signal at the high level is transmitted to the true side (T). At this time, the bar side (B) is given the low level by inverting the logic 1 of the inverted output signal of the main amplifier MA0.

In the aforementioned circuit DSCR01R, the output signal of the AND gate circuit G4 is dropped to the low level (of the logic 0) in response to the address signal X1B which is dropped to the low level when the word lines W2 and W3 are selected, so that the non-inverted output and the inverted output of the main amplifier MA0 are outputted as they are to the true side (T) and the bar side (B).

In the constructions of the memory cell arrays and the column switches, as shown in FIG. 10, not only the address signal X1 at the less significant second bit, as described above, but also the address signal X11 for dividing the lefthand area A and the righthand area B is used at the output side of the main amplifier MA1, which is made receptive of the output signal of the input/output lines CD1 corresponding to the complementary data lines D1 having their middle portions twisted, so that the read data are inverted and non-inverted.

In the data scramble circuit DSCR02R corresponding to the complementary data lines D having been twisted, as described above, the control signals of an exclusive OR circuit EX6 for controlling the inversion/non-inversion of the non-inverted output signal of the main amplifier MA1 is produced by the actions of: an AND gate circuit G5 made receptive of the address signal X1 and the control signal TMTE which are dropped to the low level when the aforementioned word lines W0 and W1 are selected; an AND gate G6 made receptive of the address signal X11 and the control signal TMTE for dividing the aforementioned lefthand area A and righthand area B; and an exclusive OR circuit EX5 made receptive of the output signals of those gate circuits G5 and G6.

The righthand area B of the memory cell array may substantially perform operations similar to those of the data scramble circuit DSCR01R because it receives no influence of the aforementioned data line twist. Specifically, in the righthand area B, the output signal of the AND gate G6 is raised to the high level in response to the high level of the address signal X11 so that the exclusive OR circuit EX5 inverts and transmits the output signal of the AND gate circuit G5. Thus, reading operations similar to those of the case of no data line twist are performed in the righthand area B of the aforementioned memory cell array.

In the lefthand area A of the memory cell array, a data scramble is performed contrary to that of the righthand area B because the inverted data lines and the non-inverted data lines are interchanged by the aforementioned data line twist. Specifically, in the low level of the address signal X11, the output signal of the AND gate circuit G6 is raised to the high level in the test mode in response to the high level of the control signal TMTE. Therefore, the exclusive OR circuit EX5 inverts and transmits the output signal of the AND gate circuit G5. In other words, when the word lines W0 and W1 are selected in response to the address signal X1B, the non-inverted output of the main amplifier MA1 is transmitted as it is. When the word lines W2 and W3 are selected, the non-inverted output of the main amplifier MA1 is inverted and transmitted. A similar discussion applies to the data scramble circuit DSCR02R which is disposed at the non-inverted output side of tile main amplifier MA1. The data scramble circuit DSCR02R can be simply replaced by an inverter circuit like before.

In the following, the input/output lines CD2 having no data line twist are equipped with the aforementioned data scramble circuit DSCR01R, and the input/output lines CD3 having the data line twist are equipped with the aforementioned data scramble circuit DSCR02R.

FIG. 8 is a timing chart for explaining one example of the operations of the dynamic RAM according to the present invention. In FIG. 8, there are shown the setting operation in the test mode and the resetting operations in the read mode, the write mode and the test mode.

The setting of the test mode is performed by dropping the column address strobe signal CASB and the write enable signal WEB to the low level, that is, by setting the so-called "WCBR refresh mode" before the row address strobe signal RASB is dropped to the low level. By setting this test mode, the control signal TMTE is set to the active level at the high level. In the aforementioned setting of the test mode, a dummy refreshing operation is performed. Specifically, a refresh control signal REF is produced, and the address, which is produced by the refresh control circuit RFC in response to an activating pulse AR of the row address buffer RAB, is transmitted to the row address buffer RAB to effect the selecting operation of the word lines. After this, the sense amplifier SA is operated in response to a sense amplifier activating signal PA so that the selected memory cells are refreshed. At the end of this refreshing operation, an address increment pulse RC is produced to increment the refresh address by +1.

Next, in response to the low level of the row address strobe signal RASB, the activation pulse AR is generated so that the address signals inputted to the address terminals A0 to A11 are fetched by the row address buffer RAB. The word lines are selected in accordance with those addresses, and the sense amplifiers SA are activated in response to the activation pulses PA. Subsequently, in response to the low level of the column address strobe signal CASB, the activation pulses AC are generated so that the address signals inputted to the address terminals A0 to A11 are fetched by the column address buffer CAB. At this time, in response to the high level of the write enable signal WEB, it is decided that the mode is the read mode, and a read mode signal R is generated. In this read mode, the aforementioned read data of 16 bits are degenerated to 1 bit and outputted as the decision result of coincidence/incoincidence because the test circuit is activated.

Next, in response to the low level of the row address strobe signal RASB, the activating pulses AR are generated so that the address signals inputted to the address terminals A0 to A11 are fetched by the row address buffer RAB. In accordance with these addresses, the word lines are selected, and the sense amplifiers SA are activated in response to the activating pulses PA. Subsequently, in response to the low level of the column address strobe signal CASB, the activating pulses are produced so that the address signals inputted to the address terminals A0 to A11 are fetched by the column address buffer CAB. In response to the low level of the write enable signal WEB, it is decided that the mode is the write mode, and a write mode signal W is generated. In this write mode, the aforementioned batch write of 16 bits is performed because the test circuit is activated. In case the aforementioned data scrambles of FIG. 5 are provided, their operations are validated to invert the write data corresponding to the specific input/output lines in accordance with the fetched addresses.

The resetting of the test mode is performed, before the row address strobe signal RASB is dropped to the low level, by dropping the column address strobe signal CASB to the low level, that is, by setting the so-called "CBR refresh mode". By setting this CBR refresh mode, the test mode is reset to reset the control signal TMTE to the low level. In the resetting of the aforementioned test mode, the dummy is refreshed. Specifically, the refresh control signal REF is produced, and the addresses generated by the refresh control circuit RFC in response to the activating pulses AR of the row address buffer RAB are transmitted to the row address buffer RAB to effect the selecting operation of the word lines. After this, the sense amplifiers SA are operated in response to the sense amplifier activating signal PA so that the selected memory cells are refreshed. At the end of the refreshing operation, the address increment pulses RC are generated to increment the refresh addresses by +1.

Figure 9:
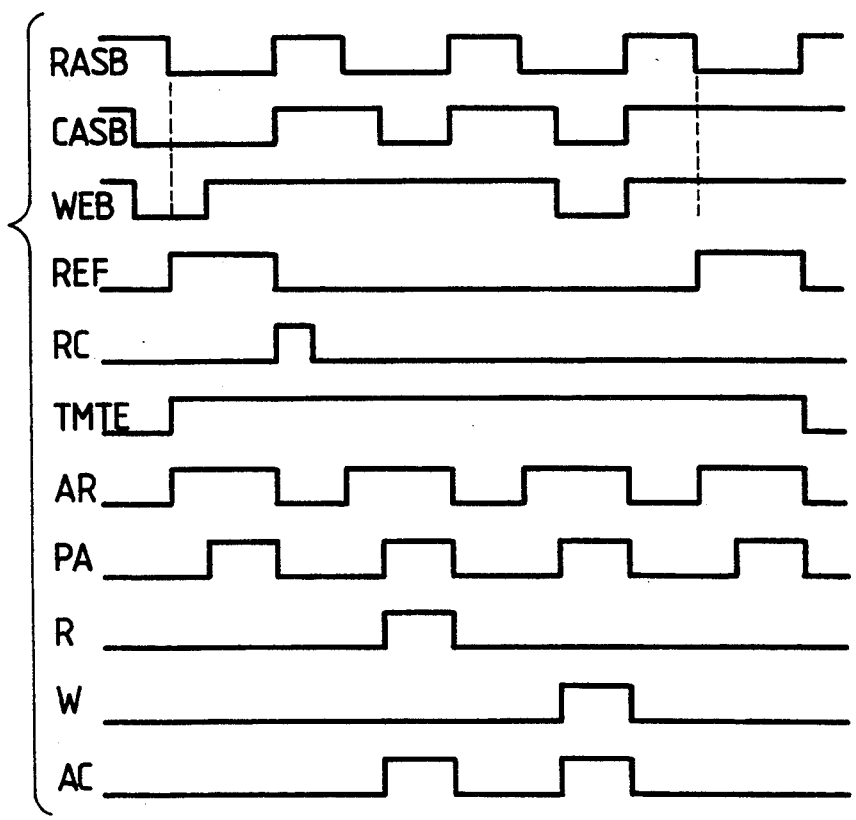
FIG. 9 is a timing chart for explaining another example of the operation of the dynamic RAM according to the present invention.

FIG. 9 is a timing chart for explaining another example of the operations of the dynamic RAM according to the present invention. In FIG. 9, there are shown the individual operations of setting the test mode and resetting the read mode, the write mode and the test mode.

The operations of setting the test mode and resetting the read mode and the write mode will not be described because they are similar to those of the timing chart of FIG. 8. In this embodiment, a RAS only refresh operation is used for the resetting operation of the test mode. Specifically, the word line selecting operation is performed by causing the refresh addresses inputted to the address terminals A0 to A11 in response to the activating pulses AR of the row address buffer RAB to be fetched in response to the low level of the row address strobe signal RASB, and the refreshing operation is performed by operating the sense amplifiers SA in response to the sense amplifier activating signal PA. At the end of this RAS only refreshing operation, the test mode is reset, and the control signal TMTE is reset to the low level.

In the resetting operation of the test mode, as in this embodiment, the normal mode can be instantly entered while stabilizing the state of the internal circuit constructed of the dynamic circuit, by making use of the refreshing operation.

The operational effects to be achieved from the foregoing embodiments are as follows.

(1) In a memory cell array having a plurality of memory cells connected to store physical information levels different in adjoining pairs of complementary data lines, those pairs of the memory cells, with which are connected the memory cells for storing the physical information levels in an identical pattern, are connected with a plurality of input-/output lines by a column select circuit, so that the plurality of memory cells may be caused to perform the writing operations simultaneously in a test mode by feeding an identical write signal to the plurality of input/output lines, whereby the levels to be written according to the write data inputted from the outside and the address information can be made coincident. As a result, the physical data to be stored in the memory cells can be made coincident while using the batch write mode. Thus, it is possible to provide an effect that the testing time can be shortened.

(2) Thanks to the data scramble circuit in which, in the test mode, the input write data are processed so that the physical information levels of adjoining memory cells to be simultaneously written in the plurality of memory cells may be coincident, it is possible to provide an effect that the testing time can be shortened.

Although our invention has been specifically described in connection with the embodiments thereof, it should not be limited to the foregoing embodiments but can naturally be modified in various manners within the scope of the gist thereof. If the data lines of the memory cell arrays have an N-kinds of twist patterns, as shown in FIG. 1, the complementary data lines of every N-numbers may be combined and connected with the corresponding input/output lines by the column switches. In the data scramble circuits, on the other hand, the address information to be inputted may be increased to effect the data conversion in accordance with the patterns of the individual complementary data lines. Moreover, the data scramble circuits may not only effect a physical coincidence between the memory data of the memory cells selected simultaneously but also be modified to store the physical data different among the adjoining memory cells although identical data are inputted from the outside. In this modification, the batch writing operation can be used to form the so-called "checker patterns".

The entire layout of the dynamic RAM can have its peripheral circuit arrangement modified in various manners if it is based upon the aforementioned construction shown in FIG. 4. Moreover, the number of the memory cell arrays and the construction of their peripheral circuits can be modified in various manners. Although the description thus far made has been directed to the case in which the present invention is applied to a large-scale dynamic RAM providing the technical field backgrounding it, the present invention can also be applied to even a static RAM of the data line twist type, if the write data inputted from the outside and the stored data of the memory cells are not physically coincident.

The effects obtained from the representative of the invention disclosed herein will be briefly described in the following. Specifically, in a memory cell array having a plurality of memory cells connected to store physical information levels different in adjoining pairs of complementary data lines, those pairs of the memory cells, with which are connected the memory cells for storing the physical information levels in an identical pattern, are connected with a plurality of input/output lines by a column select circuit, so that the plurality of memory cells may be caused to perform the writing operations simultaneously in a test mode by feeding an identical write signal to the plurality of input/output lines. Alternatively, in the test mode, the input write data are processed so that the physical information levels of adjoining memory cells to be simultaneously written in the plurality of memory cells may be coincident. Thus, it is possible to shorten the testing time because the information levels of the adjoining bits can be made physically identical or different by combining the address selection and the write data.

What is claimed is:

1. A semiconductor memory device comprising a first memory block, a second memory block, a first pair of common data lines and a second pair of common data lines, wherein each of said first and second memory blocks comprises:

a first sense amplifying means having first and second terminals;

a second sense amplifying means having third and fourth terminals;

first and second data lines each of which is coupled to said first sense amplifying means;

third and fourth data lines each of which is coupled to said second sense amplifying means;

first and second word lines;

a first memory cell coupled to said first data line and said first word line;

a second memory cell coupled to said first data line and said second word line;

a third memory cell coupled to said third data line and said first word line;

a fourth memory cell coupled to said fourth data line and said second word line;

wherein said first and second memory cells store data of a first level when said first terminal is at a first level, wherein said third memory cell stores data of said first level when said third terminal is at said first level, wherein said fourth memory cell stores data of a second level when said third terminal is at said first level, wherein said first pair of common data lines are coupled to said first to fourth terminals of said first and second sense amplifying means in said first memory block, and wherein said second pair of common data lines are coupled to said first to fourth terminals of said first and second sense amplifying means in said second memory block; and switching means coupled between said first to fourth terminals of said first and second sense amplifying means in said first and second memory blocks and said first and second pair of common data lines, and for coupling said first and second terminals of said first sense amplifying means in said first and second memory blocks to said first and second pair of common data lines at the same time, respectively, and for coupling said third and fourth terminals of said second sense amplifying means in said first and second memory blocks to said first and second pair of common data lines at the same time, respectively.

2. A semiconductor memory device according to claim 1, wherein said first level is a high level, wherein said second level is a low level, and wherein said first level is a high level.

3. A semiconductor memory device according to claim 2, wherein said first and second memory cells store data of said first level when said first terminal is at said first level and said second terminal is at a second level different from said first level, wherein said third memory cell stores data of said first level when said third terminal is at said first level and said fourth terminal is at said second level, and wherein said fourth memory cell stores data of said second level when said third terminal is at said first level and said fourth terminal is at said second level.

4. A semiconductor memory device according to claim 1, wherein said first level is a high level, wherein said second level is a low level, and wherein said first level is a low level.

5. A semiconductor memory device according to claim 1, wherein each of said first and second sense amplifying means is a differential sense amplifier.

6. A semiconductor memory device according to claim 1, wherein each of said first to fourth memory cells comprises a capacitor, and wherein the capacitor in the memory cell stores data of said first level as a stored-electric charge.

7. A semiconductor memory device according to claim 1, wherein said first word line in said first memory block is coupled to said first word line in said second memory block, and wherein said second word line in said first memory block couples to said second word line in said second memory block.

8. A semiconductor memory device according to claim 1, wherein said memory device further comprises a test circuit coupled to said first pair of common data lines and said second pair of common data lines, and for receiving first data based on writing data inputted from outside of said semiconductor memory device in a test mode of operation of said memory device, and wherein said test circuit outputs second data based on said first data to said first pair of common data lines and said second pair of common data lines so that each of said first and second terminals of said first sense amplifying means in said first memory block and each of said first and second terminals of said first sense amplifying means in said second memory block are coupled to receive the same level data at the same time in said test mode, or each of said third and fourth terminals of said second sense amplifying means in said first memory block and each of said third and fourth terminals of said second sense amplifying means in said second memory block are coupled to receive the same level data at the same time in said test mode.

9. A semiconductor memory device according to 8, wherein said test circuit receives reading data from said first pair of common data lines and said second pair of common data lines, and outputs data which is degenerated according to said reading data in said test mode.

10. A semiconductor memory device according to claim 1, wherein said test circuit receives third data based on writing data inputted from outside of said memory device in a normal mode of operation of said memory device, and wherein said test circuit outputs fourth data based on said third data to one pair of said first pair of common data lines and said second pair of common data lines so that one pair of said first and second data lines or said third and fourth data lines in said first and second memory blocks receive said fourth data in said normal mode.

11. A semiconductor memory device according to claim 8, further comprising a main amplifier coupled between said test circuit and said first and second pair of common data lines, for amplifying data from said first pair of common data lines and said second pair of common data lines.

12. A semiconductor memory device according to claim 1, wherein each of said first and second memory blocks further comprises:

a third word line;
a fourth word line;
a fifth memory cell coupled to said third word line and said second data line;
a sixth memory cell coupled to said fourth word line and said second data line;
a seventh memory cell coupled to said third word line and said fourth data line; and
an eighth memory cell coupled to said fourth word line and said third data line.

13. A semiconductor memory device according to claim 1, wherein said first data line and said second data line are twisted at least at one point between said first word line and said second word line, and wherein said third data line and said fourth data line are not twisted between said first word line and said second word line.

14. A semiconductor memory device according to claim 1, wherein said first data line and said second data line are twisted at a predetermined odd number of points between said first word line and said second word line, and wherein said third data line and said fourth data line are twisted at a predetermined even number of points between said first word line and said second word line.

15. A semiconductor memory device according to claim 1 further comprising third and fourth pairs of common data lines, a third memory block and a fourth memory block, wherein each of said third and fourth memory blocks comprises:
   a third sense amplifying means having fifth and sixth terminals;
   a fourth sense amplifying means having seventh and eighth terminals;
   fifth and sixth data lines each of which is coupled to said third sense amplifying means;
   seventh and eighth data lines each of which is coupled to said fourth sense amplifying means;
   third and fourth word lines;
   a fifth memory cell coupled to said fifth data line and said third word line;
   a sixth memory cell coupled to said fifth data line and said fourth word line;
   a seventh memory cell coupled to said seventh data line and said third word line; and
   an eighth memory cell coupled to said eighth data line and said fourth word line, wherein said fifth and sixth memory cells store data of said first level when said fifth terminal is at said first level, wherein said seventh memory cell stores data of said first level when said seventh terminal at in said first level, wherein said eighth memory cell stores data of said second level when said seventh terminal at in said first level, wherein said third pair of common data lines are coupled to said fifth to eighth terminals of said third memory block, and wherein said fourth pair of common data lines are coupled to said fifth to eighth terminals of said fourth memory block; and
   second switching means coupled between said fifth to eighth terminals of said third and fourth sense amplifying means in said third and fourth memory blocks and said third and fourth pair of common data lines, and for coupling said fifth and sixth terminals of said third and fourth sense amplifying means in said third and fourth memory blocks to said third and fourth pair of common data lines at the same time, respectively, and for coupling said seventh and eighth terminals of said third and fourth sense amplifying means in said third and fourth memory blocks to said third and fourth pair of common data lines at the same time, respectively.

16. A semiconductor memory device comprising first and second memory arrays each of which comprises a first memory block, a second memory block, a first pair of common data lines and a second pair of common data lines, wherein each of said first and second memory blocks comprises:
   a first sense amplifying means having first and second terminals;
   a second sense amplifying means having third and fourth terminals;
   first and second data lines each of which is coupled to said first sense amplifying means;
   third and fourth data lines each of which is coupled to said second sense amplifying means;
   first and second word lines;
   a first memory cell coupled to said first data line and said first word line;
   a second memory cell coupled to said first data line and said second word line;
   a third memory cell coupled to said third data line and said first word line;
   a fourth memory cell coupled to said fourth data line and said second word line, wherein said first and second memory cells store data of a first level when said first terminal is at a first level, wherein said third memory cell stores data of said first level when said third terminal is at said first level, wherein said fourth memory cell stores data of a second level when said third terminal is at said first level, wherein said first pair of common data lines are coupled to said first to fourth terminals of said first and second sense amplifying means in said first memory block, and wherein said second pair of common data lines are coupled to said first to fourth terminals of said first and second sense amplifying means in said second memory block; and
   switching means coupled between said first to fourth terminals of said first and second sense amplifying means in said first and second memory blocks and said first and second pair of common data lines, and for coupling said first and second terminals of said first sense amplifying means in said first and second memory blocks to said first and second pair of common data lines at the same time, respectively, and for coupling said third and fourth terminals of said second sense amplifying means in said first and second memory blocks to said first and second pair of common data lines at the same time, respectively,
   wherein said memory device further comprises a test circuit coupled to said first pair of common data lines and said second pair of common data lines in said first and second memory blocks in each of said first and second memory arrays, and for receiving first data based on writing data inputted from outside of said memory device, and
   wherein said test circuit outputs second data based on said first data to said first pair of common data lines and said second pair of common data lines in said first and second memory arrays so that each of said first terminals of said first sense amplifying means in said first and second memory blocks in each of said first and second memory arrays receives the same level data at the same time.

17. A semiconductor memory device according to claim 16, wherein said test circuit receives reading data from said first pair of common data lines and said second pair of common data lines in said first and second memory arrays, and outputs data which is degenerated according to said reading data.

18. A semiconductor memory device according to claim 16, wherein said test circuit receives third data based on writing data inputted from outside of said memory device in a normal mode of operation of said memory device, and
   wherein said test circuit outputs fourth data based on said third data to one of said first pair of common data lines and said second pair of common data lines in said first and second memory arrays so that one pair of said first and second data lines, and third and fourth data lines in said first and second memory arrays receive said fourth data.

19. A semiconductor memory device according to claim 16 further comprising a main amplifier coupled between said test circuit and said first and second pair of common data lines in said first and second memory arrays, for amplifying data from said first and second pair of common data lines in said first and second memory arrays.

20. A semiconductor memory device comprising a first memory block, a second memory block, a first pair of common data lines and a second pair of common data lines, wherein each of said first and second memory blocks comprises:
   a first sense amplifying means having first and second terminals;
   a second sense amplifying means having third and fourth terminals;
   first and second data lines each of which is coupled to said first sense amplifying means;
   third and fourth data lines each of which is coupled to said second sense amplifying means;
   first and second word lines;
   a first memory cell coupled to said first data line and said first word line;
   a second memory cell coupled to said first data line and said second word line;
   a third memory cell coupled to said third data line and said first word line;
   a fourth memory cell coupled to said fourth data line and said second word line, wherein said first and second memory cells store data of a first level when said first terminal is at a first level, wherein said third memory cell stores data of said first level when said third terminal is at said first level, wherein said fourth memory cell stores data of a second level when said third terminal is at said first level, wherein said first pair of common data lines are coupled to said first and second terminals of said first amplifying means in said first and second memory blocks, and wherein said second pair of common data lines are coupled to said third and fourth terminals of said second sense amplifying means in said first and second memory blocks; and
   switching means coupled between said first to fourth terminals of said first and second sense amplifying means in said first and second memory blocks, and said first and second pair of common data lines, and for coupling said first to fourth terminals of said first and second sense amplifying means in said first memory blocks to said first and second pair of common data lines at the same time, respectively, and for coupling said first to fourth terminals of said first and second sense amplifying means in said second memory blocks to said first and second pair of common data lines at the same time, respectively; and
   means for receiving first data, for outputting second data to said first pair of common data lines, and for outputting third data to said second pair of common data lines so that said first and third memory cells of said first memory block and said first and third memory cells of said second memory block are set with data having same physical level at the same time, respectively.

21. A semiconductor memory device according to 20, wherein said first level is a high level, wherein said second level is a low level, and wherein said first level is a high level.

22. A semiconductor memory device according to claim 21, wherein said first and second memory cells store data of said first level when said first terminal is at said first level and said second terminal is at a second level different from said first level,
   wherein said third memory cell stores data of said first level when said third terminal is at said first level and said fourth terminal is at said second level, and
   wherein said fourth memory cell stores data of said second level when said third terminal is at said first level and said fourth terminal is at said second level.

23. A semiconductor memory device according to claim 20, wherein said first level is a high level, wherein said second level is a low level, and wherein said first level is a low level.

24. A semiconductor memory device according to claim 20, wherein each of said first and second sense amplifying means is a differential sense amplifier.

25. A semiconductor memory device according to claim 20, wherein each of said first to fourth memory cells comprises a capacitor, wherein the capacitor in the memory cell stores data of said physical first level as a stored electric charge.

26. A semiconductor memory device according to claim 20, wherein said first word line in said first memory block is coupled to said first word line in said second memory block, and wherein said second word line in said first memory block is coupled to said second word line in said second memory block.

27. A semiconductor memory device according to claim 20, wherein each of said first and second memory blocks further comprises:
   a third word line;
   a fourth word line;
   a fifth memory cell coupled to said third word line and said second data line;
   a sixth memory cell coupled to said fourth word line and said second data line;
   a seventh memory cell coupled to said third word line and said fourth data line; and
   an eighth memory cell coupled to said fourth word line and said third data line.

28. A semiconductor memory device according to claim 20, wherein said first data line and said second data line are twisted at least at one point between said first word line and said second word line, and
   wherein said third data line and said fourth data line are not twisted between said first word line and said second word line.

29. A semiconductor memory device according to claim 20, wherein said first data line and said second data line are twisted at a predetermined odd number of points between said first word line and said second word line, and
   wherein said third data line and said fourth data line are twisted on a predetermined even and points between said first word line and said second word line.

30. A semiconductor memory device according to claim 20, wherein said first data is inputted from outside of said memory device.

31. A semiconductor memory device according to claim 20, wherein said first data is data based on writing data inputted from outside of said memory device.

32. A semiconductor memory device according to claim 20, wherein said second and third data are outputted to said first and second pairs of common data lines in a test mode of operation of said memory device, respectively.

33. A semiconductor memory device according to claim 32, further comprising means for receiving reading data from said first pair of common data lines and said second pair of common data lines, and for outputting data which is degenerated according to said reading data in said test mode.

34. A semiconductor memory device according to claim 32, wherein said memory device further comprises means for receiving fourth data based on writing data inputted from outside of said memory device, and for outputting fifth data based on said third data to one pair of said first pair of common data lines and said second pair of common data lines so that one pair of said first and second data lines or said third and fourth data lines in said first and second memory blocks receive said fourth data in a normal mode of operation of said memory device.

35. A semiconductor memory device according to claim 20, wherein said means for receiving said first data further receives a first signal for designating which of said first word line or said second word line is selected.

36. A semiconductor memory device according to claim 27, wherein said means for receiving said first data further receives a first signal and a second signal, wherein said first signal designates which of said first and third word lines or said second and fourth word lines are to be selected, and wherein said second signal designates which of the memory cells coupled to said first or third data lines, or the memory cells coupled to said second or fourth data lines are to be selected.

37. A semiconductor memory device according to claim 20, wherein said first data line receives data which is the same data with regard to said first data, when said first and second data lines are coupled to said first pair of common data lines and said first word line is selected.

38. A semiconductor memory device according to claim 37, wherein said first data line receives data which is the same data with regard to said first data, when said first and second data lines are coupled to said first pair of common data lines and said second word line is selected.

39. A semiconductor memory device according to claim 20, wherein said third data line receives data which is the same data with regard to said first data, when said third and fourth data lines are coupled to said second pair of common data lines and said first word line is selected.

40. A semiconductor memory device according to claim 39, wherein said fourth data line receives data which is the same data with regard to said first data, when said third and fourth data lines are coupled to said second pair of common data lines and said second word line is selected.

41. A semiconductor memory device according to claim 27, wherein said first data line receives data which is the same data with regard to said first data, when said first and second data lines are coupled to said first pair of common data lines and said first word line is selected.

42. A semiconductor memory device according to claim 41, wherein said first data line receives data which is the same data with regard to said first data, when said first and second data lines are coupled to said first pair of common data lines and said second word line is selected.

43. A semiconductor memory device according to claim 42, wherein said second data line receives data which is the same data with regard to said first data, when said first and second data lines are coupled to said first pair of common data lines and said third word line is selected.

44. A semiconductor memory device according to claim 43, wherein said second data line receives data which is the same data with regard to said first data, when said first and second data lines are coupled to said first pair of common data lines and said fourth word line is selected.

45. A semiconductor memory device according to claim 27, wherein said third data line receives data which is the same data with regard to said first data, when said third and fourth data lines are coupled to said second pair of common data lines and said first word line is selected.

46. A semiconductor memory device according to claim 45, wherein said fourth data line receives data which is the same data with regard to said first data, when said third and fourth data lines are coupled to said second pair of common data lines and said second word line is selected.

47. A semiconductor memory device according to claim 46, wherein said fourth data line receives data which is the same data with regard to said first data, when said third and fourth data lines are coupled to said second pair of common data lines and said third word line is selected.

48. A semiconductor memory device according to claim 47, wherein said third data line receives data which is the same data with regard to said first data, when said third and fourth data lines are coupled to said second pair of common data lines and said fourth word line is selected.

* * * * *